US008276109B2

(12) United States Patent
Penzes et al.

(10) Patent No.: US 8,276,109 B2
(45) Date of Patent: Sep. 25, 2012

(54) MIXED-HEIGHT HIGH SPEED REDUCED AREA CELL LIBRARY

(75) Inventors: Paul Penzes, Newport Beach, CA (US); Koen Lampaert, Tustin, CA (US)

(73) Assignee: Broadcom Corporation, Irvine, CA (US)

(*) Notice: Subject to any disclaimer, the term of this patent is extended or adjusted under 35 U.S.C. 154(b) by 526 days.

(21) Appl. No.: 12/370,065

(22) Filed: Feb. 12, 2009

(65) Prior Publication Data

US 2010/0162187 A1 Jun. 24, 2010

Related U.S. Application Data

(60) Provisional application No. 61/140,335, filed on Dec. 23, 2008.

(51) Int. Cl.
*G06F 17/50* (2006.01)
(52) U.S. Cl. ........ 716/132; 716/111; 716/119; 716/123; 716/126; 716/127; 716/133; 716/134; 716/136
(58) Field of Classification Search .................. 716/111, 716/119, 123, 126, 127, 132, 133, 134, 136
See application file for complete search history.

(56) References Cited

U.S. PATENT DOCUMENTS

| | | | | |
|---|---|---|---|---|
| 5,737,236 A | * | 4/1998 | Maziasz et al. | 716/123 |
| 5,824,570 A | * | 10/1998 | Aoki et al. | 438/128 |
| 6,006,024 A | * | 12/1999 | Guruswamy et al. | 716/126 |
| 6,336,207 B2 | * | 1/2002 | Shinomiya et al. | 716/122 |
| 6,385,761 B1 | * | 5/2002 | Breid | 716/104 |
| 6,560,753 B2 | * | 5/2003 | Barney et al. | 326/103 |
| 7,194,717 B2 | * | 3/2007 | Andreev et al. | 716/124 |
| 7,800,409 B2 | * | 9/2010 | Pitts | 326/101 |
| 7,802,219 B2 | * | 9/2010 | Tomar et al. | 716/119 |
| 7,989,849 B2 | * | 8/2011 | Sherlekar et al. | 257/207 |
| 2008/0111158 A1 | * | 5/2008 | Sherlekar et al. | 257/207 |
| 2009/0249259 A1 | * | 10/2009 | Penzes et al. | 716/1 |
| 2009/0271756 A1 | * | 10/2009 | Penzes | 716/17 |
| 2010/0058267 A1 | * | 3/2010 | Lu et al. | 716/9 |
| 2010/0162184 A1 | * | 6/2010 | Penzes | 716/1 |
| 2010/0289111 A1 | * | 11/2010 | Lee et al. | 257/499 |

* cited by examiner

*Primary Examiner* — Helen Rossoshek
(74) *Attorney, Agent, or Firm* — Sterne, Kessler, Goldstein & Fox PLLC

(57) ABSTRACT

A mixed-height cell library for designing integrated circuits is provided. The mixed-height cell library includes a first plurality of cells having a first track height and a second plurality of cells having a second track height that are configured to be coupled to the first plurality of cells at respective power and ground rail lines. A method for mixed-height cell placement and optimization is also provided. The method comprises abutting cells of different track heights to form a plurality of rows of cells by coupling power and ground rails of the cells at a secondary layer that is different from a primary layer that is used to connect active material and determining whether re-ordering cells within rows allows for further compaction of adjacent rows. The method further comprises re-ordering cells within rows so to allow for further compaction of adjacent rows. The method also includes the steps of splitting rows vertically to minimize the distance between the split rows.

18 Claims, 28 Drawing Sheets

MIXED-HEIGHT HIGH SPEED REDUCED AREA CELL LIBRARY

CROSS-REFERENCE TO RELATED APPLICATIONS

This application claims the benefit of U.S. Provisional Application No. 61/140,335 filed Dec. 23, 2008, which is incorporated herein by reference in its entirety.

FIELD OF THE INVENTION

The present invention relates generally to integrated circuit design and specifically to a mixed-height cell libraries.

BACKGROUND OF THE INVENTION

The Integrated Circuit (IC) design process typically involves specifying the functionality of the chip in a standard hardware programming language such as verilog; synthesizing/mapping the circuit description into basic gates of a Standard Cell Library using Computer Aided Design (CAD) tools such as Synopsys' DesignCompiler; placing and routing the gate netlist using CAD tools, and finally verifying proper connectivity and functionality of the circuit.

While all of these steps are very important in determining the quality of the Integrated Circuit, for most of these steps, the achievable quality of implementation is design dependent. However, the Standard Cell Library can make all IC designs better, i.e., the quality of the Standard Cell Library influences all designs, and as such it has a far reaching influence on the quality of chips. The standard cell library provides the ingredients of a chip and thus limits the achievable quality of the final product.

Many library development efforts have focused on high speed designs. However, library improvement opportunities on the lower frequency end of the spectrum (e.g., Bluetooth or Gigabit PHY products) exist as well. In the past, technology scaling had provided the necessary speed increases. With the advent of technology scaling, higher and higher levels of integration became possible due to the shrinking device sizes. Technology scaling was providing not only an area scaling but also a delay scaling. According to Moore's "Law", chips were doubling their speed every 18 months. While this "law" has been applicable for more than 20 years, a point has been reached where process scaling no longer delivers the expected speed increases. This is mainly due to the fact certain device parameters have reached atomic scales. One of the consequences of this speed saturation due to technology scaling is that designers must work harder at each stage of the design flow to achieve the last remaining circuit performance. Even small speed increases will come at significantly higher design efforts than in the past. Therefore having the best standard cell library is critical.

One technique being considered to achieve higher library speeds is the implementation of a 14-track standard cell library. This library has a cell height 40% larger than that of the base line standard cell library that is 10-tracks. The extra height allows for more active area (transistors) to be packed into cells and thus makes for more speed-efficient building blocks. However, the speed increase comes with a cost of added area and power which many portable applications are not able to tolerate. The added area increases fabrication costs, while the added power consumption (both dynamic and leakage power) reduces the battery life of products using the resulting chips.

What is therefore needed are design tools, such as enhanced Standard Cell Libraries, that can produce circuits having optimal speed and area.

What is further needed is an enhanced standard cell library that allows smooth intermixing of any track height cells and provides an effective way to combine the area/power efficiency of "short" cells with the speed advantage of "tall" cells.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

Figure 1A:
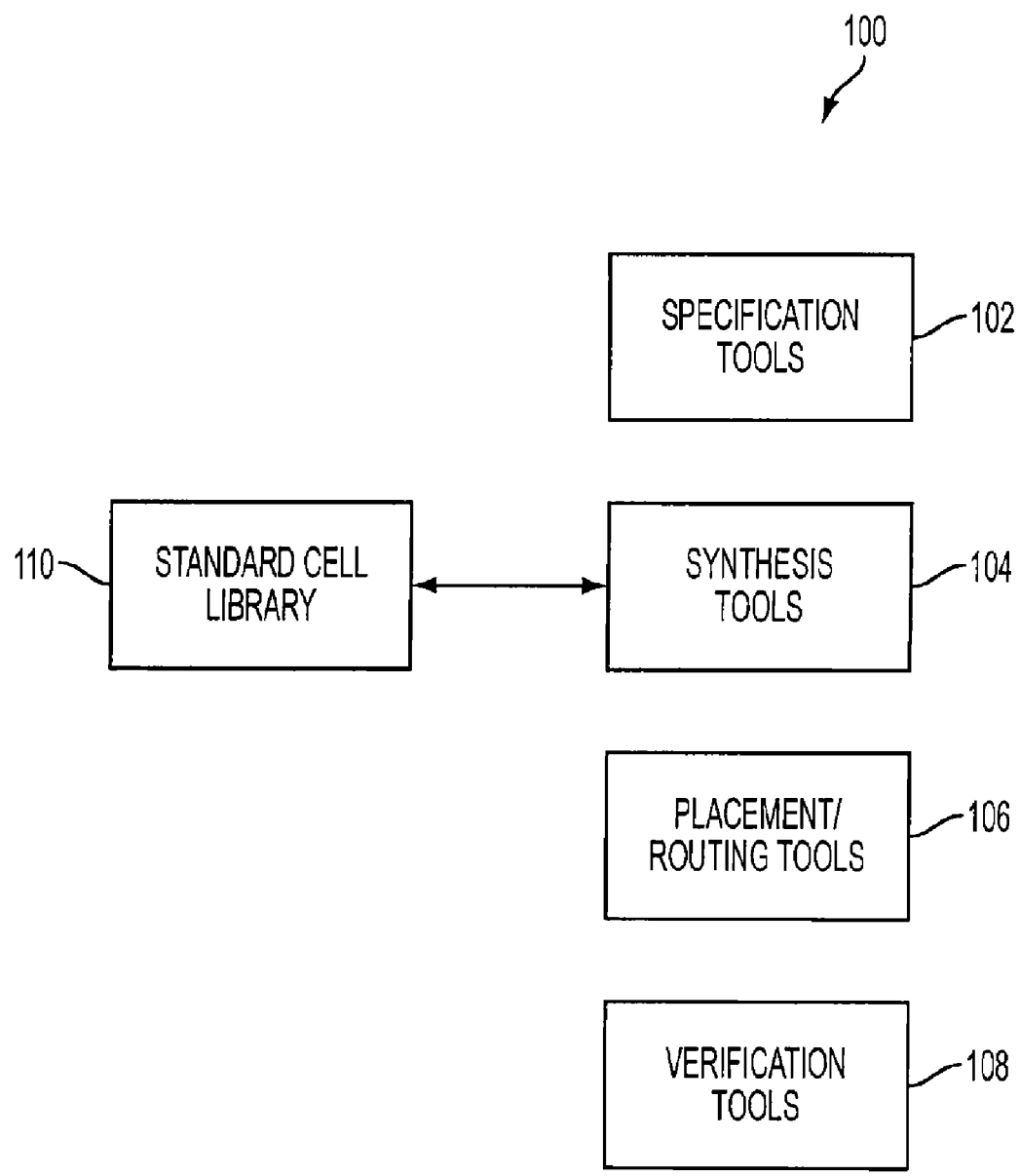
FIG. 1A depicts a high-level environment used in the design of integrated circuits, according to embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION 1.0 Overview

FIG. 1A depicts a high-level environment 100 used in the design of integrated circuits, according to embodiments of the present invention. Design environment 100 includes specification tools 102, synthesis tools 104, placement/routing tools 106, verification tools 108, and cell library 110.

During the design process, the functionality of the chip is specified in a specification tool 102 using a standard hardware programming language such as verilog. The resulting circuit description is synthesized/mapped into the basic gates of cell library 110, using one or more synthesis tools 120 such as Synopsys' DesignCompiler, produced by Synopsys, Inc. of Mountain View, Calif. The resulting gate netlist is then placed and routed using placement/routing tools 106 such as Magma's BlastFushion, produced by Magma, Inc. of San Jose, Calif. Finally, the connectivity and functionality of the integrated circuit are verified using a verification tool 108.

While each of these components is important for the final quality of the resulting integrated circuit, the quality of implementation achievable by most of these components is design dependent. For example, a good verilog code specifying a circuit A, does not make an independent circuit B any better. However, an adequate cell library makes all designs better. The quality of the cell library influences all designs and as such has a far reaching influence on the quality of the resulting integrated circuit chip.

A standard cell library includes hundreds of cells that can be selectively combined to design a larger circuit. Each cell in the library is associated with a specific logic function. Each logic function may be implemented in one or more predefined cells. For example, a logic function may have multiple layouts, each having different characteristics.

A cell in a cell library is laid out relative to a grid defined by horizontal and vertical tracks. The number of horizontal tracks defines the height of the cell and the number of vertical tracks defines the width of the cell. The number of horizontal tracks determining the height of the cell are referred to interchangeably throughout as "height" or "track height." "Layer" as referred to herein indicates one or more of the multiple layers of a die on which a chip is fabricated. Layers are typically represented in different colors by physical design tools such as Virtuoso by Cadence Design Systems, Inc. of San Jose, Calif.

Conventional standard cell libraries are comprised of cells having the same track height. However, mixed height cell libraries are also possible. A standard cell library is generally classified by its track height. For example, a 10-track library is composed of cells having heights of 10 tracks. The widths of cells in a library may vary. In conventional libraries, heights of cells are consistent to enable cells of the cell library to be readily combined to create larger circuits.

In embodiments presented herein, cell library 110 is modified to include mixed-height cells. The use of these mixed-height cells results in circuits having significant reduction in area with no associated loss of speed. Cell library 110 is composed of a base of cells from an existing X-Track Standard Cell Library and a set of cells having different heights are added to these baseline cells to generate a mixed-height cell library. The goal of a mixed-height cell library 110 is to provide an efficient library of cells that optimizes area, speed and power in integrated circuits synthesized using the mixed-height cell library.

The type and number of cells added to the existing X-Track cell library are dependent upon the efficiency required for the synthesis tool or application. Adding too many cells to a cell library may significantly reduce the efficiency of the synthesis tool and the quality of the resulting integrated circuit. This is because the synthesis tool may have difficulty handling a large number of choices for a specific logic function. Accordingly, mixed-height cells may only be provided for commonly used logic functions. Commonly used functions include, but are not limited to, AND gates, NAND gates, inverters, OR gates, NOR gates, and flip flops. As would be appreciated by persons of skill in the art, as design tools become more sophisticated, mixed-height cell library 110 can be further extended to include mixed-height cells for a majority or all supported logic functions.

Each cell in cell library 110 is associated with a set of data characterizing the cell. Example data includes the drive strength (speed) and leakage power characteristics associated with the cell. A synthesis tool uses the data or a subset of the data to determine which cell to select for the required logic function. For example, for tasks which have an extra timing margin but strict area constraints, the design tool may select a cell having less drive strength (slower speed) but smaller area. For tasks which have limited timing margin but flexible area constraints, the design tool may select a cell having greater drive strength (faster speed) and greater area.

Figure 1B:
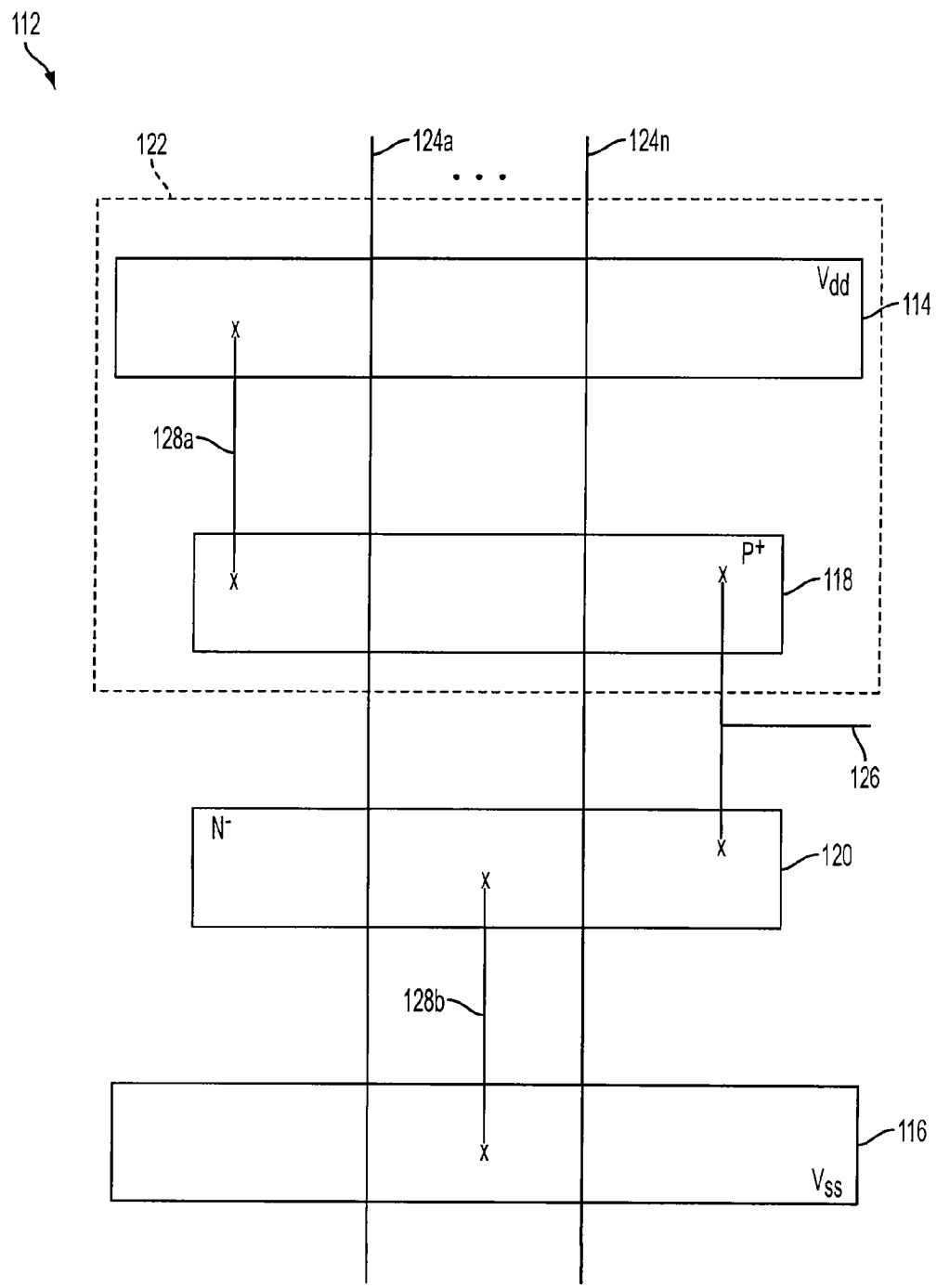
FIG. 1B illustrates an example stick-diagram layout of a cell.

FIG. 1B illustrates a stick-diagram layout of an exemplary cell 112 in cell library 110. Cell 112 comprises power rail or VDD 114, ground rail or VSS 116, p-type diffusion material (p+) 118, and n-type diffusion material (n−) 120. Power rail 114 and p-type diffusion material 118 are embedded in n-well 122. Polysilicon inputs 124a-n intersect with p-type diffusion material 118 and n-type diffusion material 120 forming transistors. For example, where polysilicon input 124 intersects p-type diffusion material 118, a p-type Metal Oxide Semiconductor (PMOS) transistor is formed, and where polysilicon input 124 intersects n-type diffusion material 120, an n-type Metal Oxide Semiconductor (NMOS) transistor is formed. Connectors 128a-b are used to connect power and ground connections to p-type diffusion material 118 or n-type diffusion material 120. Output 126 outputs the result for cell 112. The placement of polysilicon inputs 124, connectors 128 and output 126 determines the type of logic function being implemented by cell 112. For example, the logic function implemented by cell 112 is that of a NOT gate. It is to be appreciated by a person of skill in the art that the type of logic function implemented is arbitrary, design dependent and may vary. Cell library 110 typically comprises multiple cells implementing each common logic function that are used by designers and synthesis tools to create circuits.

Figure 1C:
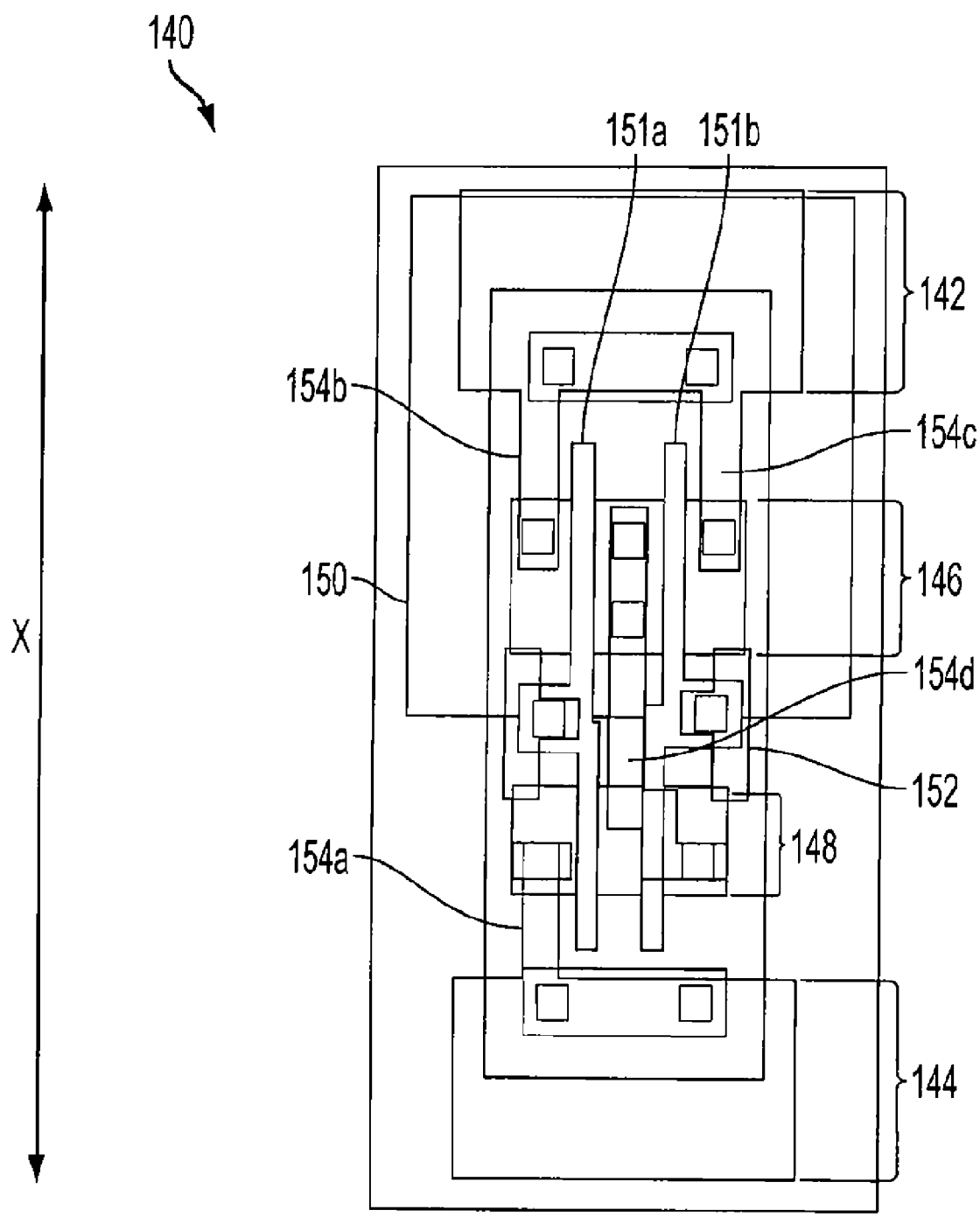
FIG. 1C illustrates an example physical design layout of a cell.

FIG. 1C illustrates an example physical design layout of a cell 140 created using a layout tools such as Virtuoso by Cadence Design Systems, Inc. of San Jose, Calif. Cell 140 includes VDD or power rail 142, VSS or ground rail 144, p-type diffusion material 146, n-type diffusion material 148, n-well 150, polysilicon inputs 151a-b, connectors 154a-d, and output 152. Position of inputs 151a-b, connectors 154a-d, and output 152 determine the logic function of cell 140. Cell 140 implements a NAND gate logic function. Cell 140 has a track height of X (e.g. 10-track height) and is conventionally combined with other cells that have the same track height as described below.

Figure 1D:
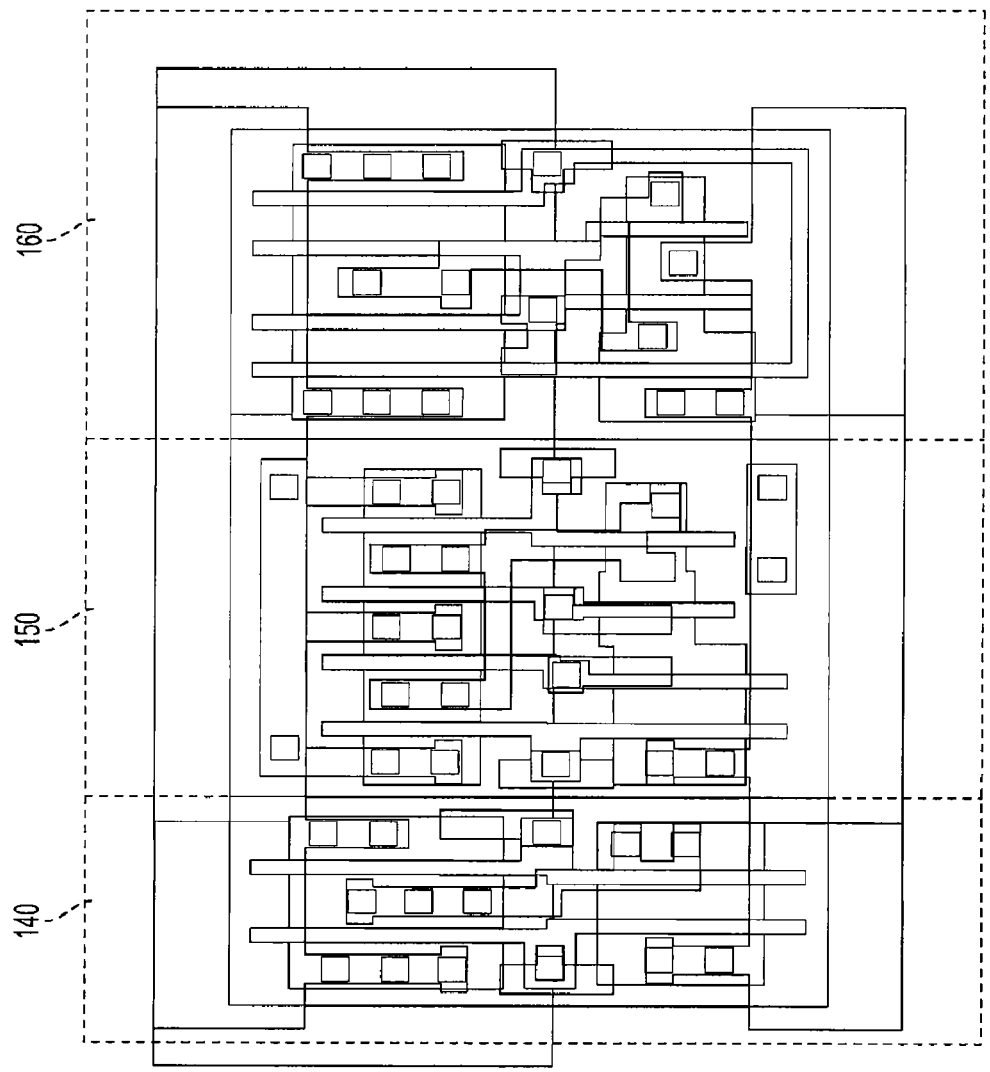
FIG. 1D illustrates a conventional physical design layout of a circuit.
Figure 2A:
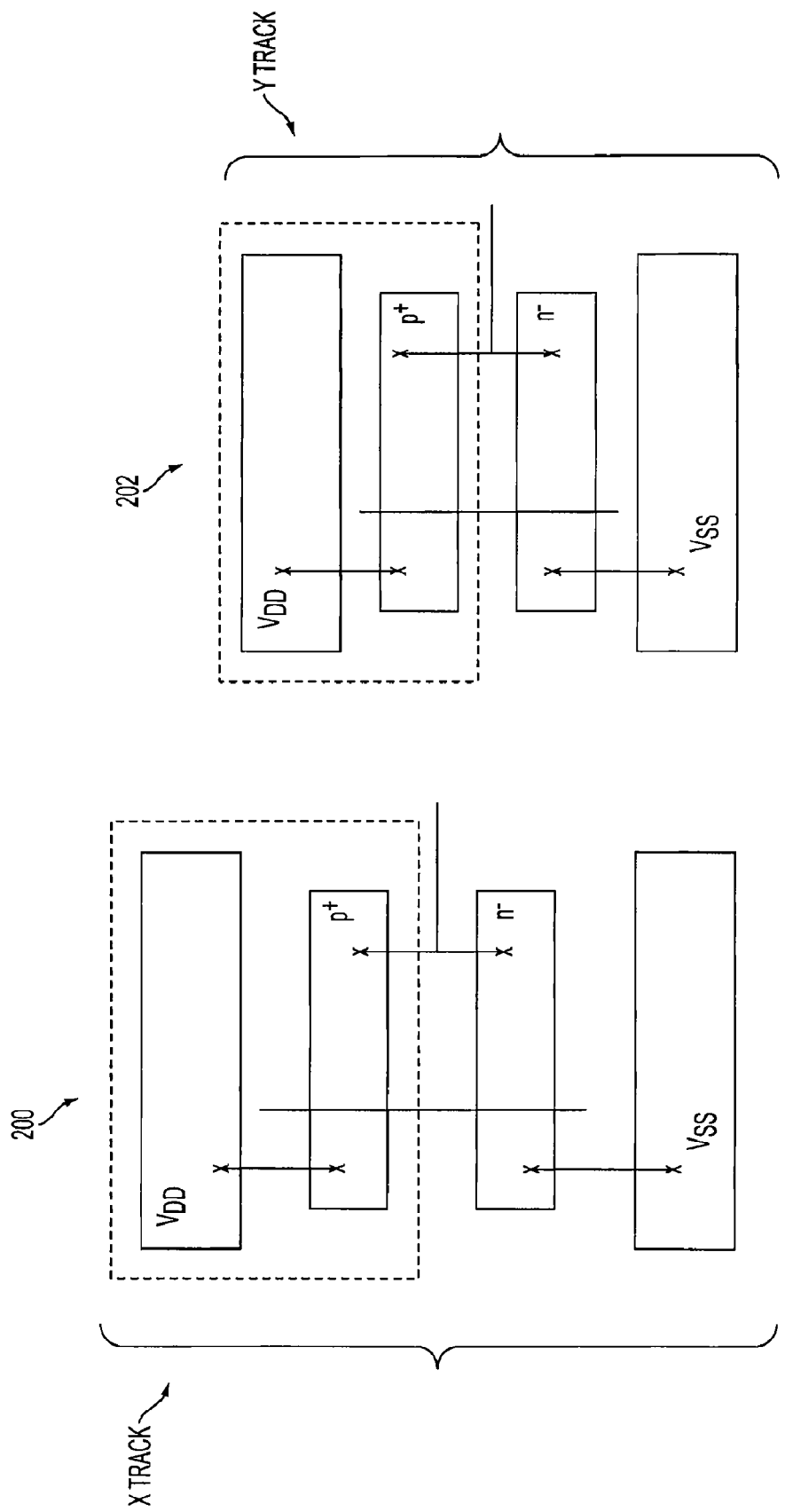
FIG. 2A illustrates exemplary stick diagram of cells that have different track heights.
Figure 2B:
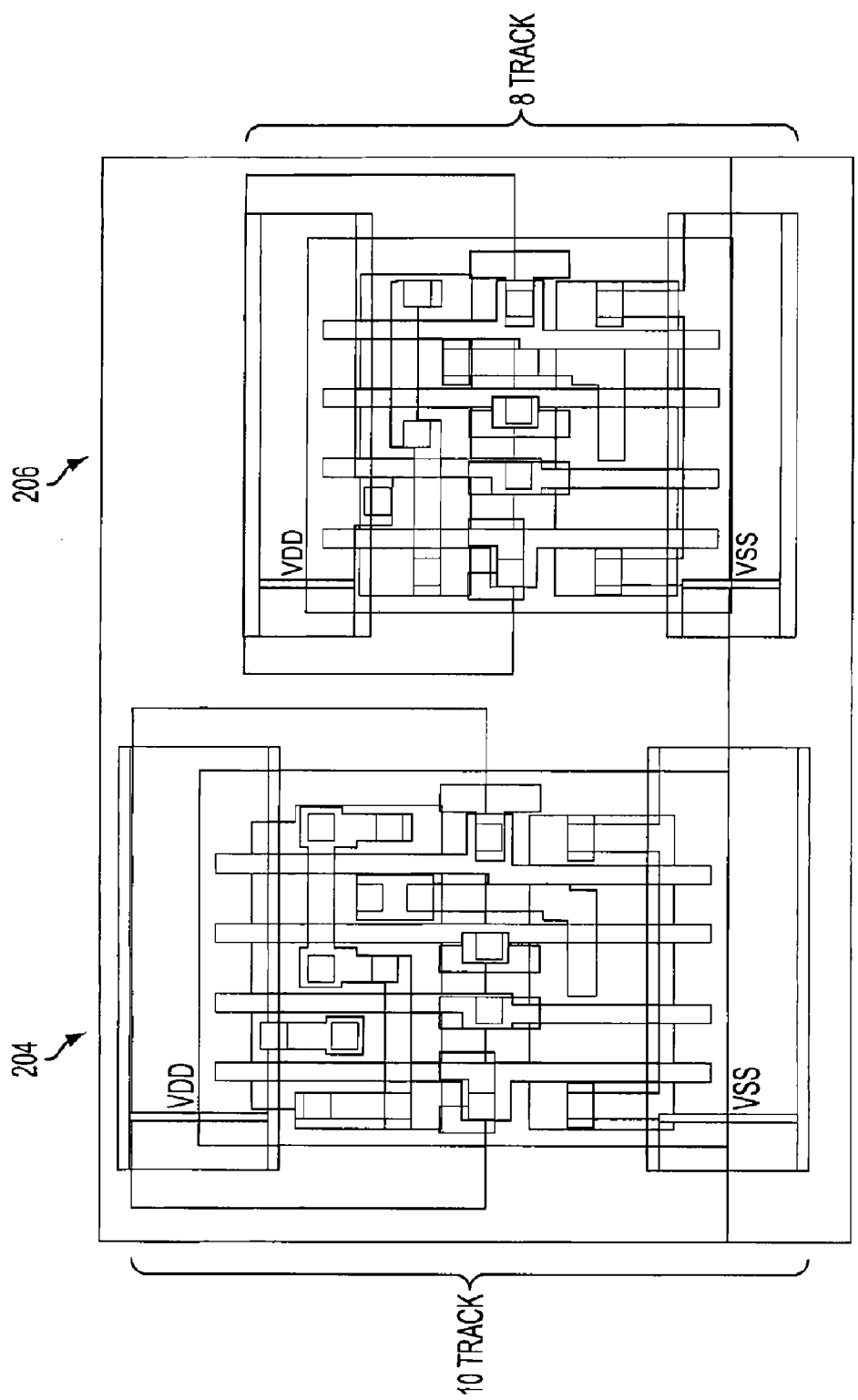
FIG. 2B illustrates exemplary physical layout of cells that have different track heights.

FIG. 1D illustrates a conventional physical design layout of a circuit using three cells. In a conventional same-height cell library, cell 140 can be coupled to other cells in the library by abutting the power and ground rails of cell 140 with corresponding power and ground rails of other cells in the library. For example, in FIG. 1D, cell 150 and cell 160 have the same track height as cell 140. This allows cells 140, 150, and 160 to be connected by abutting their respective power and ground rails. However, speed, area, power and performance are limited by using cells that have the same cell height. Therefore, it is desirable to use cells having different heights for certain applications. FIGS. 2A-2B described below illustrate the problems encountered when coupling cells of different track heights.

2.0 High-Speed Reduced Area Cell Library

FIG. 2A illustrates exemplary stick diagram of cell 200 and cell 202 that have different track heights. In the example in FIG. 2A, cell 200 has a track height X and cell 202 has a track height Y where X is greater than Y. Unlike the example shown in FIG. 1D, cell 200 and cell 202 have different track heights and cannot be combined at their respective power and ground rails because of this difference in track heights. In another example, FIG. 2B illustrates exemplary physical layout of cell 204 and 206 that have different track heights. In this example, cell 204 has a track height, of 10 and cell 206 has a track height of 8. Cells 204 and cell 206 cannot be combined by abutting their respective power and ground rails because of the difference in track heights. Embodiments presented herein overcome this limitation by providing mixed height cells that can be combined at respective power and ground layers.

Figure 3A:
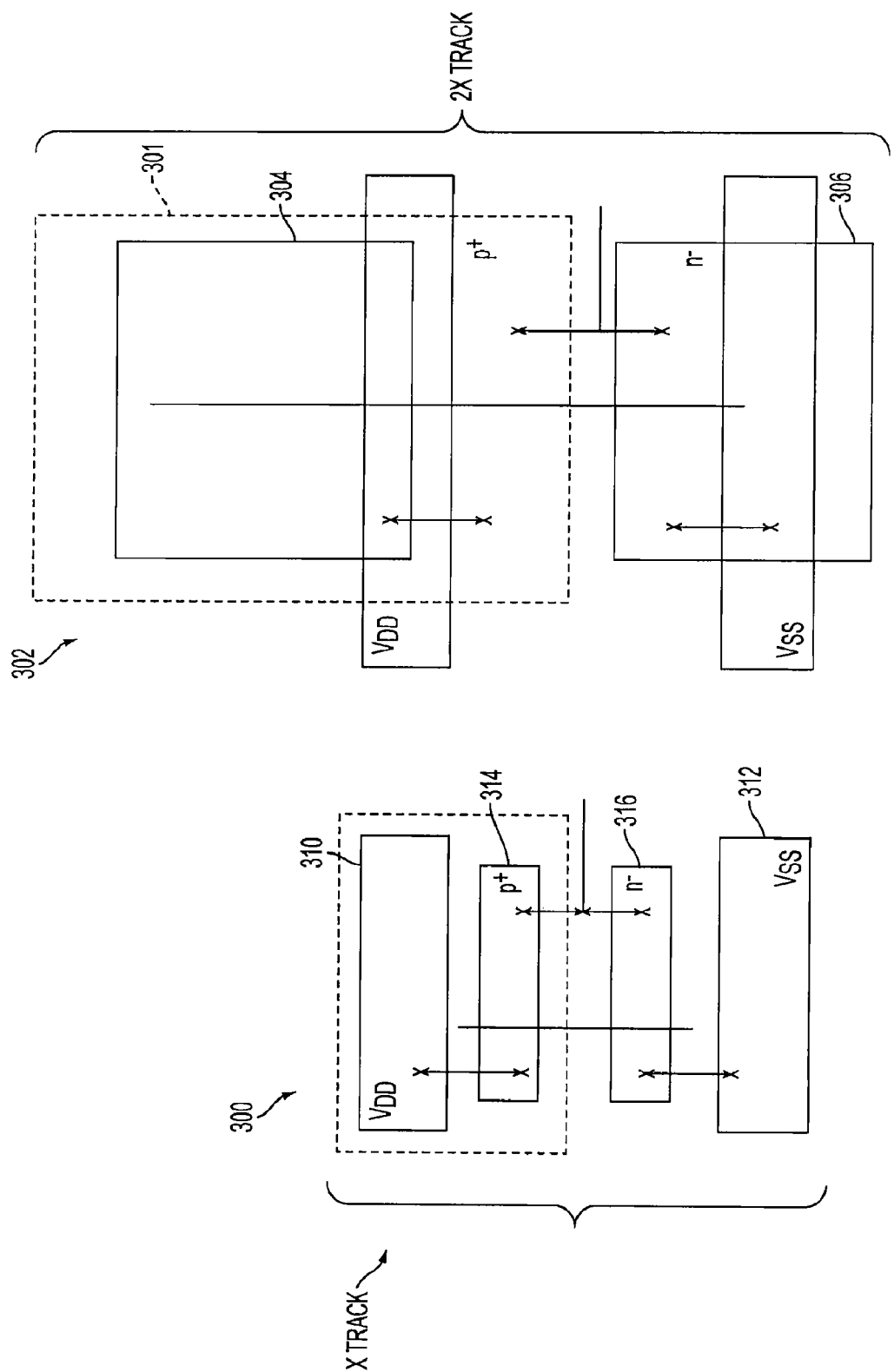
FIG. 3A illustrates an exemplary stick diagram layout of mixed-height cells that are integer multiples in track height according to an embodiment of the invention.

FIG. 3A illustrates an exemplary stick diagram layout of mixed-height cells that are integer multiples in track height, according to an embodiment of the invention. Cell 300 has a track height of X and cell 302 has a track height of 2X (a double height cell). Cell 302 is formed by extending p-type diffusion material 304, n-well 301 and n-type diffusion material 306 to an area having a height that is twice the height of diffusion material of the corresponding cell 300 while keeping the distance between power and ground rail lines for cell 302 the same as the distance between power and rail lines for cell 300. The same distance between power and ground rails for cell 300 and cell 302 allows them to be coupled at their respective power and ground rail lines.

Figure 3B:
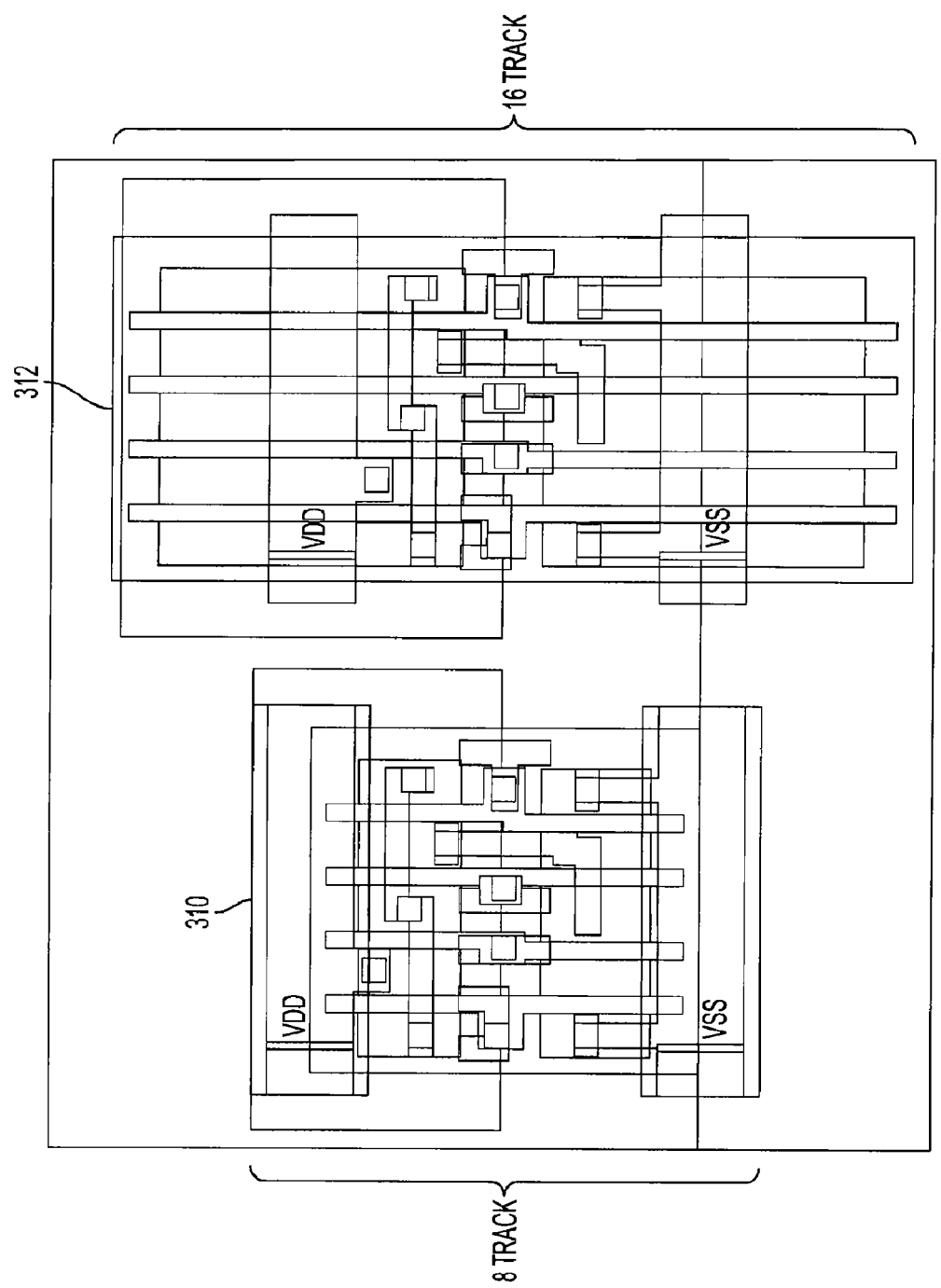
FIG. 3B illustrates an exemplary physical design layout of mixed-height cells that are integer multiples in track height according to an embodiment of the invention.

FIG. 3B illustrates an exemplary physical design layout of mixed-height cells that are integer multiples in track height, according to an embodiment of the invention. In this example, cell 310 has a track height of 8 and cell 312 has a track height of 16 (double height cell). The n-well, p-type diffusion material and n-type diffusion material of cell 312 has been extended to form a 16-track cell 312 while maintaining the same distance between the power and ground rails in cell 312 as in cell 310. The same distance between power and ground rails in cell 310 and cell 312 allows cell 310 and cell 312 to be abutted at their respective power and ground rails. This method provides substantially more active area per cell area and may be used as the preferred method of implementation for double height cells that are not flip-flops.

Figure 4A:
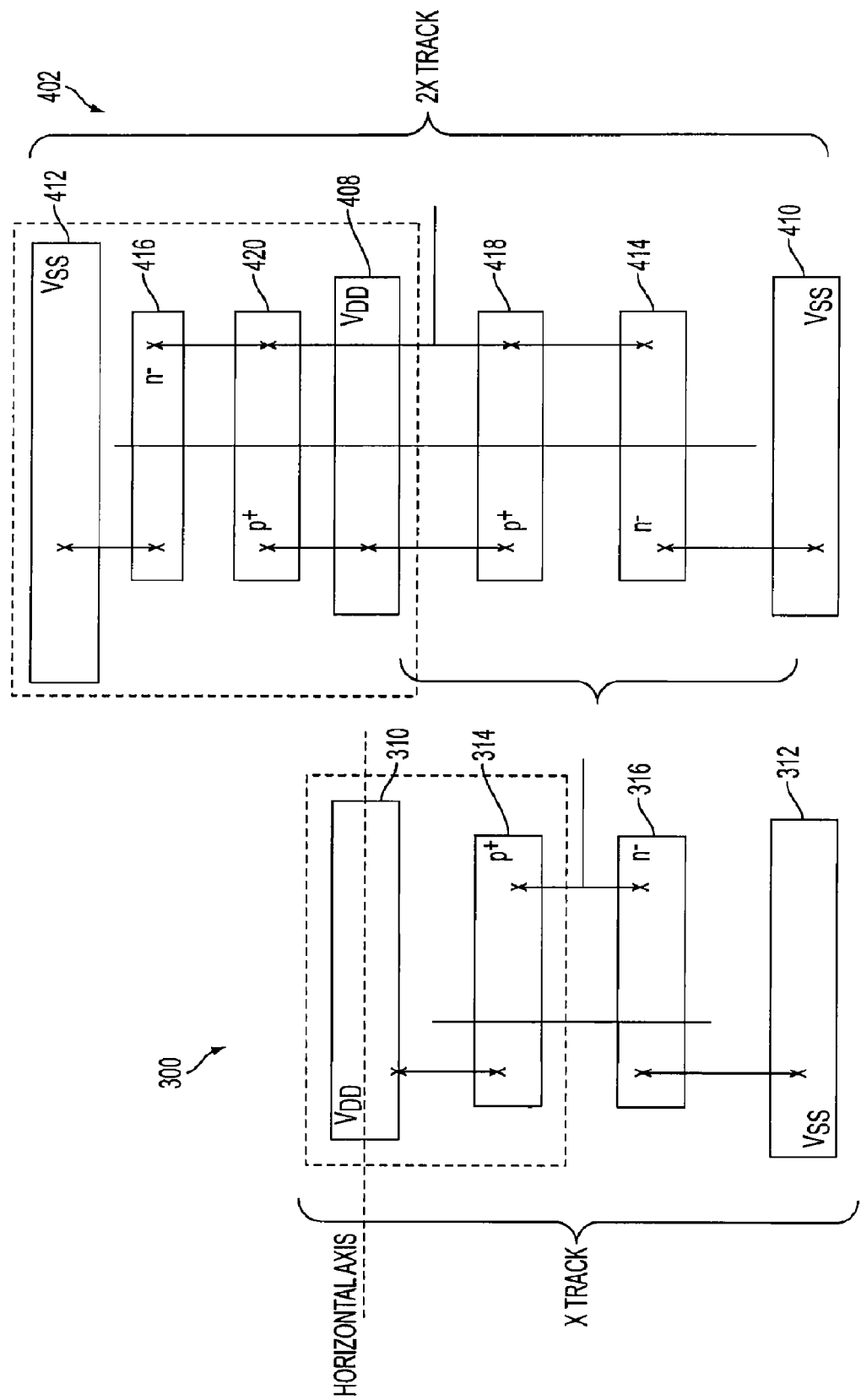
FIG. 4A illustrates an exemplary stick diagram layout of mixed-height cells that are integer multiples in track height according to an embodiment of the invention.
Figure 4B:
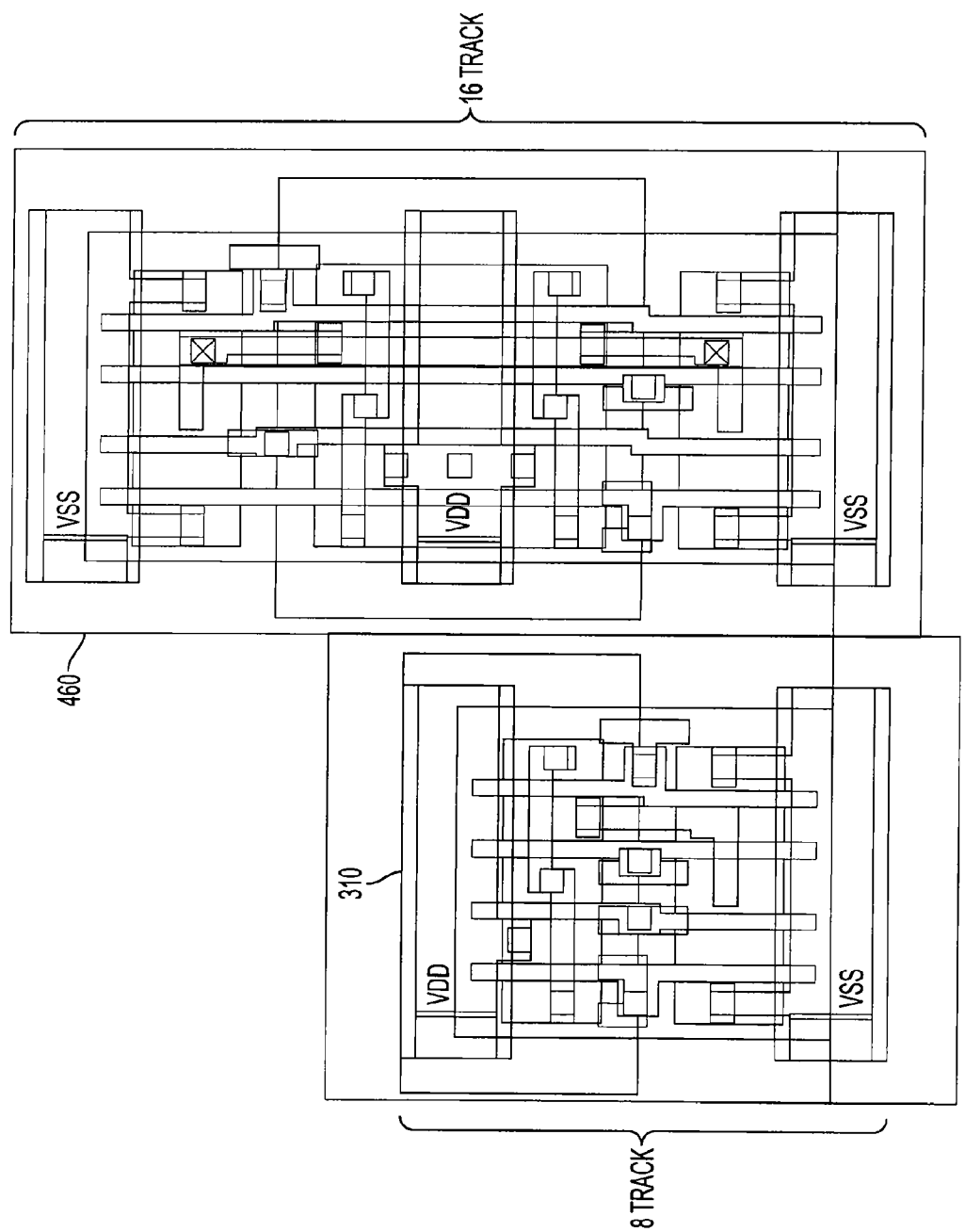
FIG. 4B illustrates an exemplary physical design layout of mixed-height cells that are integer multiples in track height according to an embodiment of the invention.

FIGS. 4A, 4B depict an alternative technique for providing mixed-height cells. FIG. 4A illustrates an exemplary stick diagram layout of mixed-height cells that are integer multiples in track height, according to an embodiment of the invention. FIG. 4A illustrates the cell 300 (from FIG. 3A) having a height track height X and a cell 402 having a track height of 2X. Cell 300 includes a single power rail 310 and a single ground rail 312 along with a single p-type diffusion material 314 and a single n-type diffusion material 316. Cell 402 is a double height cell that includes ground rail 410 and ground rail 412, n-type diffusion material 414 and n-type diffusion material 416, p-type diffusion material 418 and p-type diffusion material 420 along with a single power rail 408.

Cell 402 is created by forming a flipped mirror image of cell 300 over a horizontal axis passing through power rail 310. As seen in FIG. 4A, even though cell 402 is twice the track height of cell 300, the distance between power rail 408 and ground rail 410 of cell 402 and the distance between power rail 310 and ground rail 312 of cell 300 is the same allowing cell 300 and cell 402 to be abutted at power rail 310 and power rail 408 and at ground rail 312 and ground rail 410 respectively.

FIG. 4B illustrates an exemplary physical design layout of mixed-height cells that are integer multiples in track height according to an embodiment of the invention. Cell 310 (from FIG. 3A) has a track height of 8 and cell 460 has a track height of 16. Cell 460 is twice the track height of cell 310 and is created by forming a mirror image of cell 310 over a horizontal axis that passes through its power rail line. Cell 460 includes a single power rail line, two ground rail lines, two n-type diffusion layers and two p-type diffusion layers. Cell 310 and cell 460 can be combined at their respective power and ground rail since the distance between the power line and a first ground line of cell 460 is the same as the distance between the power and ground rail lines of cell 310. This method of creating double-height cells for a mixed height cell library is preferably applicable for creating flip-flops or other complex cells, where instead of laying down a master cell and a slave cell next to each other in a single height cell, the cells are arranged one on top of each other in a double height cell formation thereby roughly taking the same amount of area but allowing extra topological freedom for wiring. In the examples illustrated in FIGS. 3-4, the mixed height cells are double-height or twice the height of the single height cells. However, it is to be appreciated that the mixed height cells can be any integer multiple in height of the single track height cells.

Figure 4C:
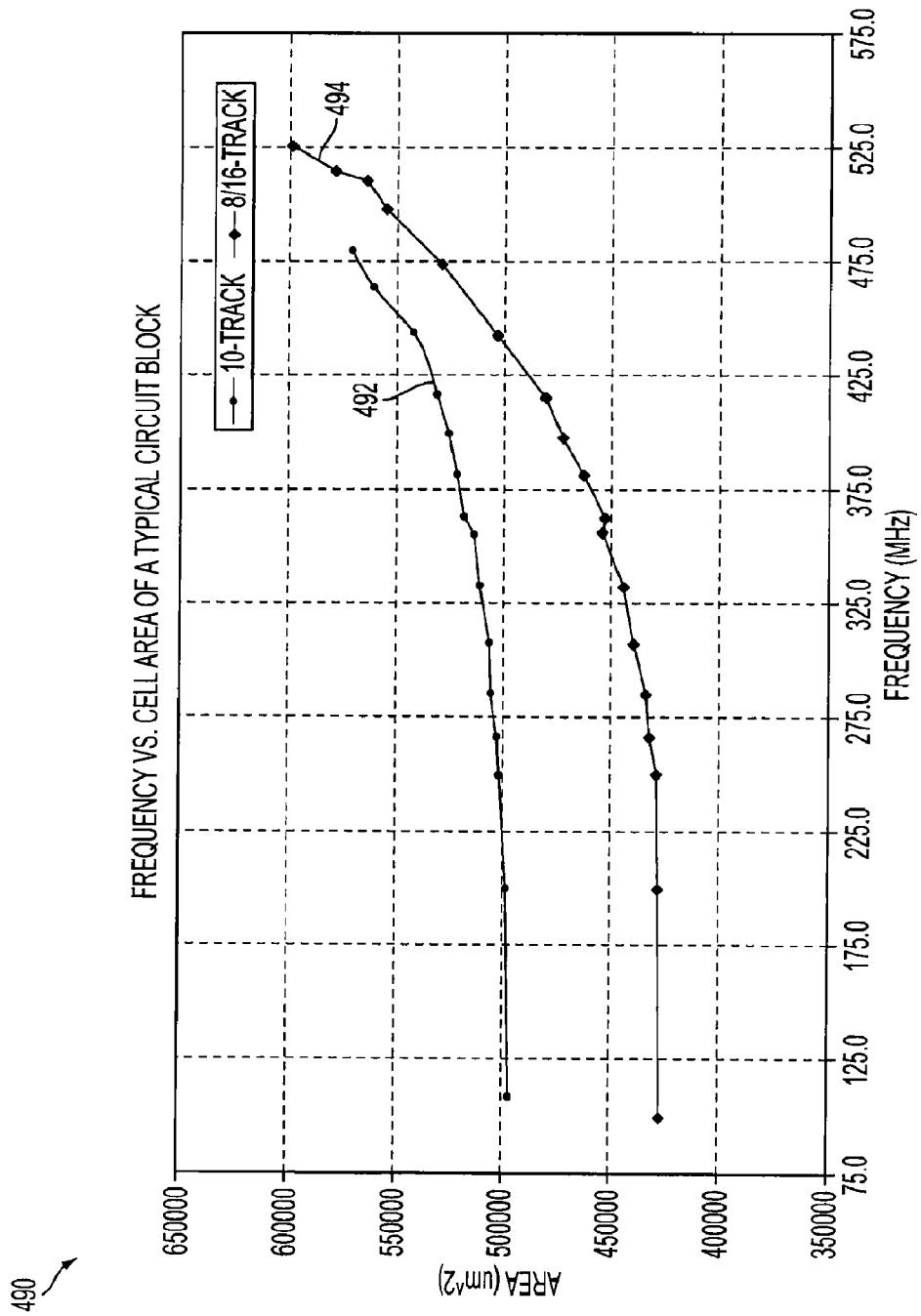
FIG. 4C depicts a graph comparing frequency vs. area for cells from a mixed track height cell library and cells from a standard single track cell library.

FIG. 4C depicts a graph 490 comparing frequency vs. area for cells from a mixed track height cell library and cells from a standard single track cell library. Curve 492 depicts frequency vs. area for cells from a single track library (e.g. 10-track library). Curve 494 depicts frequency vs. area for a cell from a mixed height library (e.g. a 8/16 track library). As seen in graph 490, once the frequency of a logic cell from either a standard library or a mixed height library drops under a certain frequency threshold (e.g. around 250 MHz in FIG. 4C), the area no longer decreases or decreases minimally. This is because all logic functions are implemented at or close to their minimal size. Typically, larger cells can operate at a higher frequency but take up significantly more area. As seen in graph 492, frequency decreases sharply with area for a single 10-track library. A single 8-track library could reduce area by up to 20%. However, there are two issues since the 8-track library will have only a few horizontal tracks and very little active area. First, only a small number of logic functions could be implemented using the 8-track library thereby increasing the need for cells with greater drive strength to be used and thereby degrading the area savings of the 8-track library. Second, the frequency of a single track (e.g. 8-track) library decreases significantly with increase in area. In particular, the above mentioned single 8-track library slows down by about 30% with relatively proportionate increase in area. This again works against the potential area savings by increasing the need for cells with higher drive strength which inherently have a larger area. Also, the frequency slowdown limits the range of applications such a library could be used in.

Embodiments presented herein address these short comings by introducing a mixed height library comprising very low track height cells (for example 8-track cells) and corresponding high track double-height cells (for example 16-track cells). These double height cells provide a more efficient way to implement higher drive strength cells, as they are able to more efficiently fit active devices in available active area. At the same time, at low frequencies only very few of these double height cells are needed, so design area is not critically impacted. Furthermore, given the double height topology, these cells provide further routing resources in the most important lowest metal layer while concurrently reducing congestion for higher metal layers. These extra routing resources then make it possible to implement more complex functions, functions that were not feasible when using a single small track height library (e.g. an 8-track). As frequency increases, more double-height cells get utilized allowing speed-ups beyond that of a 10-track cell library. For example, graph 494 indicates the frequency vs. area enhancement from using a mixed height cell library (e.g. 8/16 mixed track height library). At around 100 MHz the area savings for the mixed height 8/16-track library in graph 494 are over 14% when compared to the single height 10-track library in graph 492. As the frequency increases even to 400 MHz, the area savings in graph 494 are still over 10% when compared to graph 492 of the single track library. Furthermore, a drive strength of bigger cells in the mixed-height library is higher than a drive strength of smaller cells. The leakage power of the bigger cells in the mixed-height library is greater than a leakage power of smaller cells. For example, double height cells may have twice the drive strength and leakage power of the corresponding single height cells. Similarly, cells that are integer multiples in height of other cells may have integer multiple of drive strength and leakage power of the corresponding single height cells. In embodiments, mixed height cell libraries may be used only in critical paths to preserve area saving while maintaining desired frequency. Furthermore, combining a short track height cell with a double height cell reduces area, power and/or leakage power since the double height cell provides the increased drive strength (more power) while the smaller cell provides the area and leakage power savings.

Figure 5A:
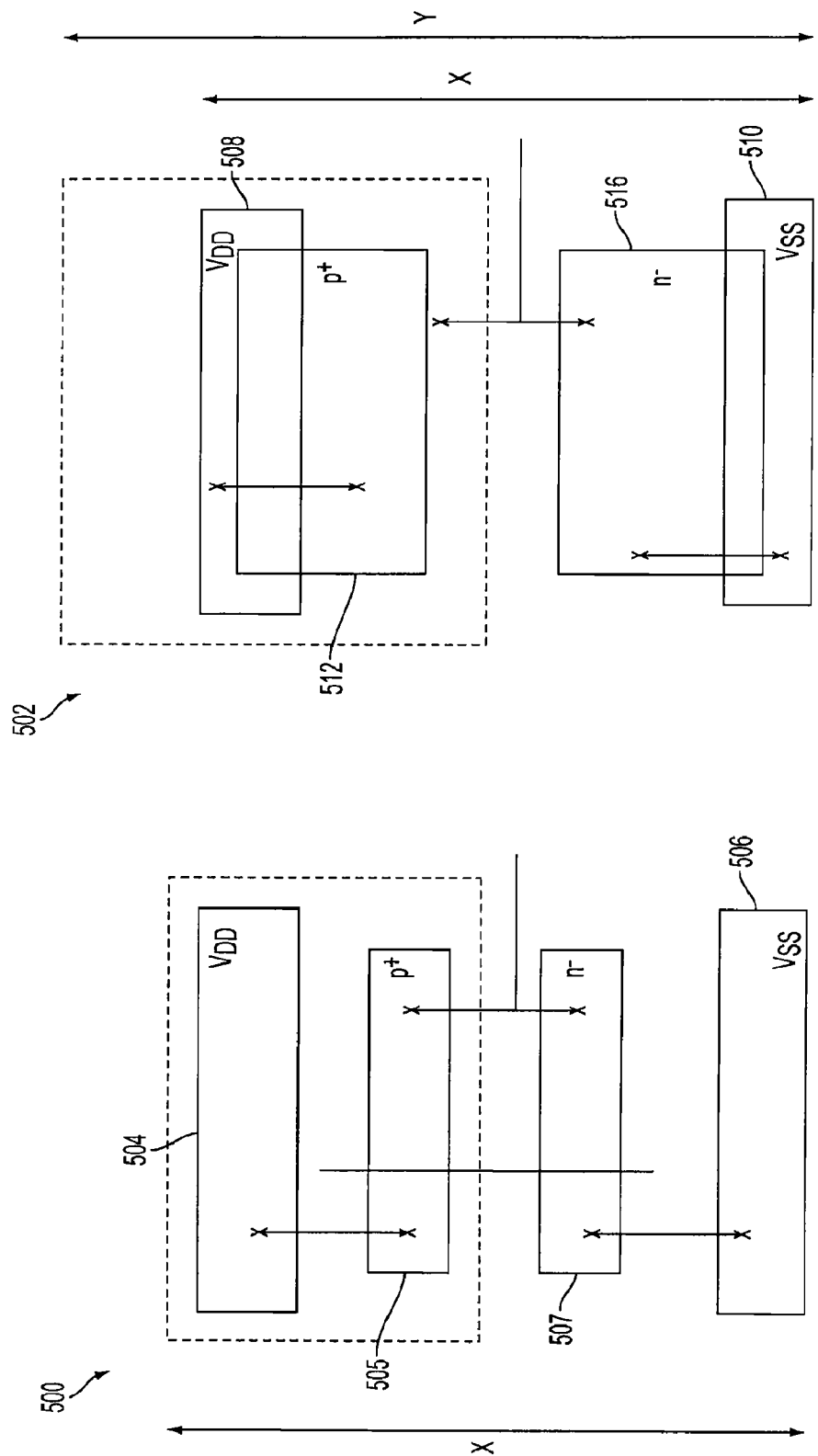
FIG. 5A illustrates an example stick diagram layout of cells in a mixed height library according to an embodiment of the invention.

FIG. 5A illustrates an example stick diagram layout of cells in a mixed height library, according to an embodiment of the invention. In the example of FIG. 5A, cell 500 has a track height of X and cell 502 has a track height of Y, where Y is greater than X.

The distance between power rail 504 and ground rail 506 of cell 500 is the same as the distance between power rail 508 and ground rail 510 of cell 502. In conventional libraries that have cells of the same track height, power and ground rails are routed in the same layer that is used to connect the active areas that include p-type diffusion material and n-type diffusion material. The layer that is used to connect the active areas may be different from the layer that includes p-type diffusion material and n-type diffusion material. In conventional design methodology, the distance between power and ground rails cannot be the same for cells having different track heights since it leads to overlap of power rail and ground rails with wires that connect active areas such as p-type diffusion material and n-type diffusion materials. Therefore, conventional library designs are limited to single track height cells since cells of different track heights cannot be combined due to difference in distance between respective power and ground rails. In the embodiment presented in FIG. 5A, power rail 508 is at a different layer (e.g. metal 2 layer) of the chip than the wires that connect p-type diffusion material 512 and hence there is no contact between power rail 508 and wires that connect p-type diffusion material 512. Similarly ground rail 510 is at a different layer of the chip as the wires that connect the n-type diffusion material 516 and hence there is no contact between ground rail 510 and the wires that connect n-type diffusion material 516. Since there is no contact between power/ground rails and active areas, power rail 508 can overlap p-type diffusion material 512 and ground rail 510 can overlap n-type diffusion material 516 while not having actual physical contact between power/ground rails and active areas. Power rail 504 and ground rail 506 are also at the same layer of a chip (e.g. metal 2 layer) as power rail 508 and ground rail 510. Since there is no restriction on where power rail 508 and ground rail 510 can be placed in relation to p-type diffusion material 512 and n-type diffusion material 516, power rail 508 and ground rail 510 can be arranged so that the distance between them is the same as the distance X between power rail 504 and ground rail 506 of cell 500. Since the distance between power rail 504 and ground rail 506 and power rail 508 and ground rail 510 is the same, cells 500 and cell 502 can be combined at their respective power and ground layers.

Figure 5B:
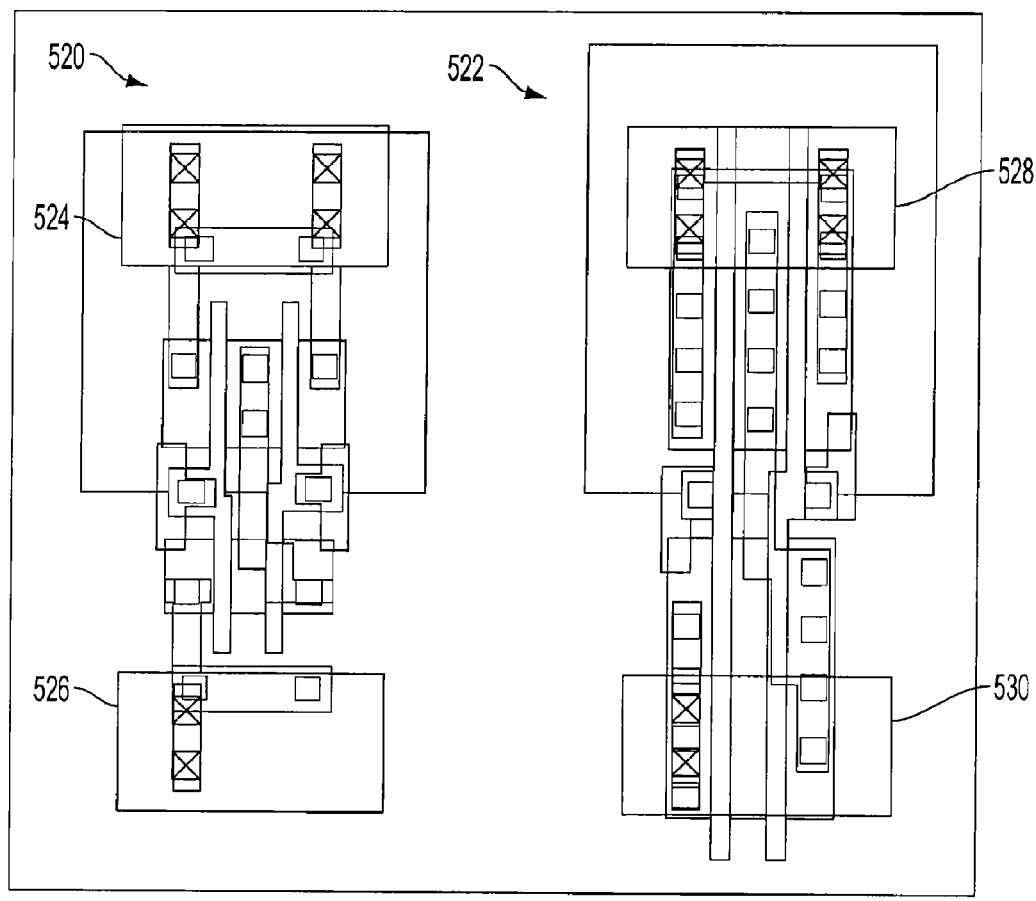
FIG. 5B illustrates a physical design layout of cells of a mixed height library according to an embodiment of the invention.

Similarly, FIG. 5B illustrates a physical design layout of cells of a mixed height library according to an embodiment of the invention. In this example, cell 520 and cell 522 have a different track height while having the same distance between power and ground rails. Power rail 524 and ground rail 526 of cell 520 and power rail 528 and ground rail 530 of cell 522 are at the same layer (e.g metal layer 2) and this layer is different from the layer that connects active material for cell 520 and cell 522. As a result cell 520 and cell 522 can be combined at their respective power and ground rails.

Figure 5C:
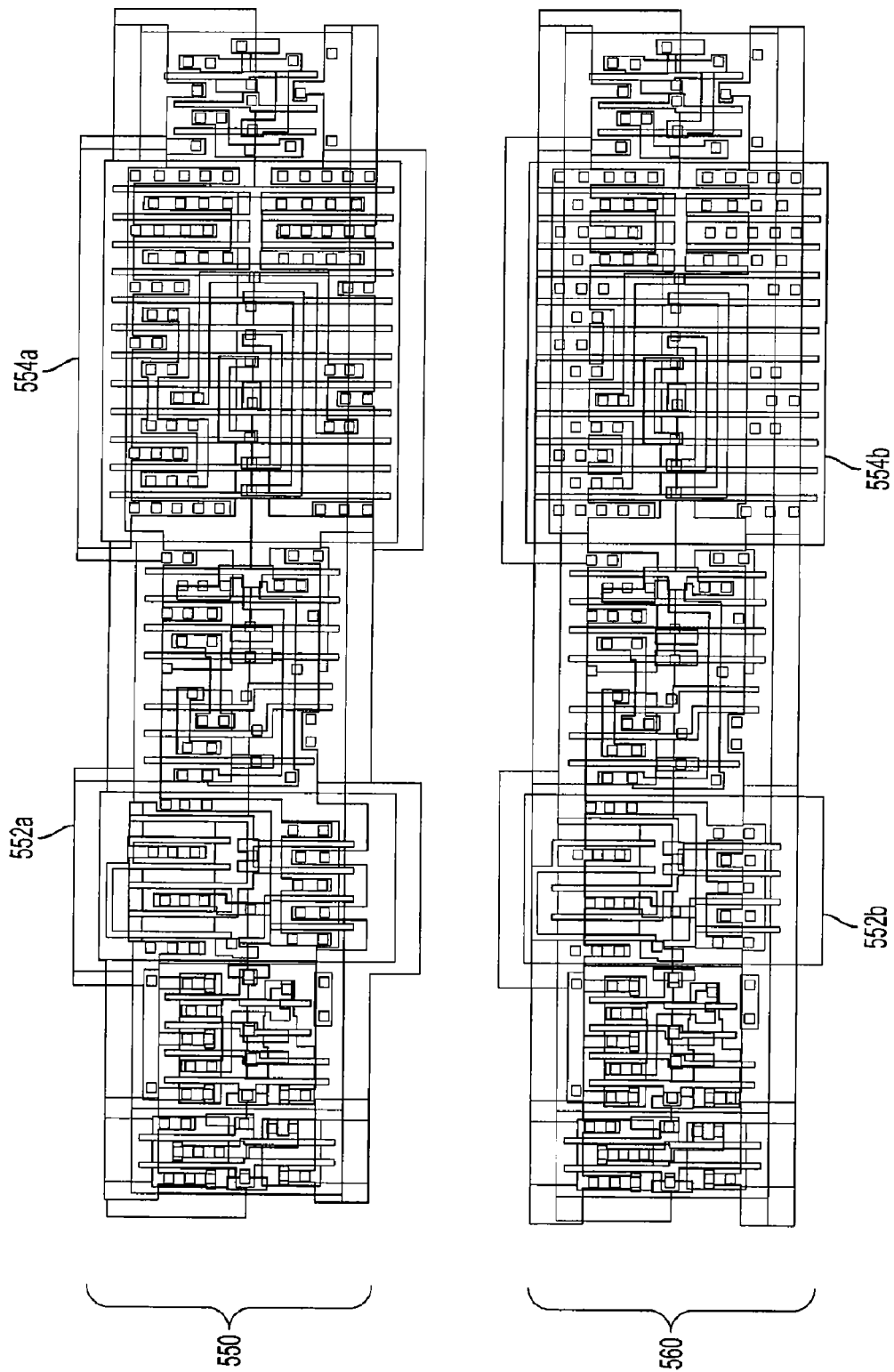
FIG. 5C illustrates example optimization in a row of cells according to an embodiment of the invention.

FIG. 5C illustrates example optimization in a row of cells according to an embodiment of the invention. In the example in FIG. 5C, row 550 illustrates how conventionally formed cells of different track heights with different distances between power and ground rails cannot be combined in a single row. In row 550, cell 522a and cell 554a have a greater cell height than other cells in row 550. As can be seen in row 550, the power and ground rails do not abut. Since the distance between power and ground rails of cell 552a and cell 554a is greater than that of other cells in row 550, cell 552a and cell 554a cannot be placed in row 550.

In contrast to row 550, row 560 includes cells 552b and cell 554b formed according to an embodiment of the invention as in FIG. 5C. In row 560, cell 552b and 554b have a greater cell height than other cells in row 560 but, according to an embodiment of the invention, cell 552b and cell 554b route their power rail and ground rail at the same distance and the same layer (e.g. metal layer 2) as the other cells in row 560. Hence, cells 552b and cell 554b can be combined with cells in row 560 by abutting respective power and ground rails.

3.0 Method for Creating and Using Mixed Height Cell Libraries

Figure 8A:
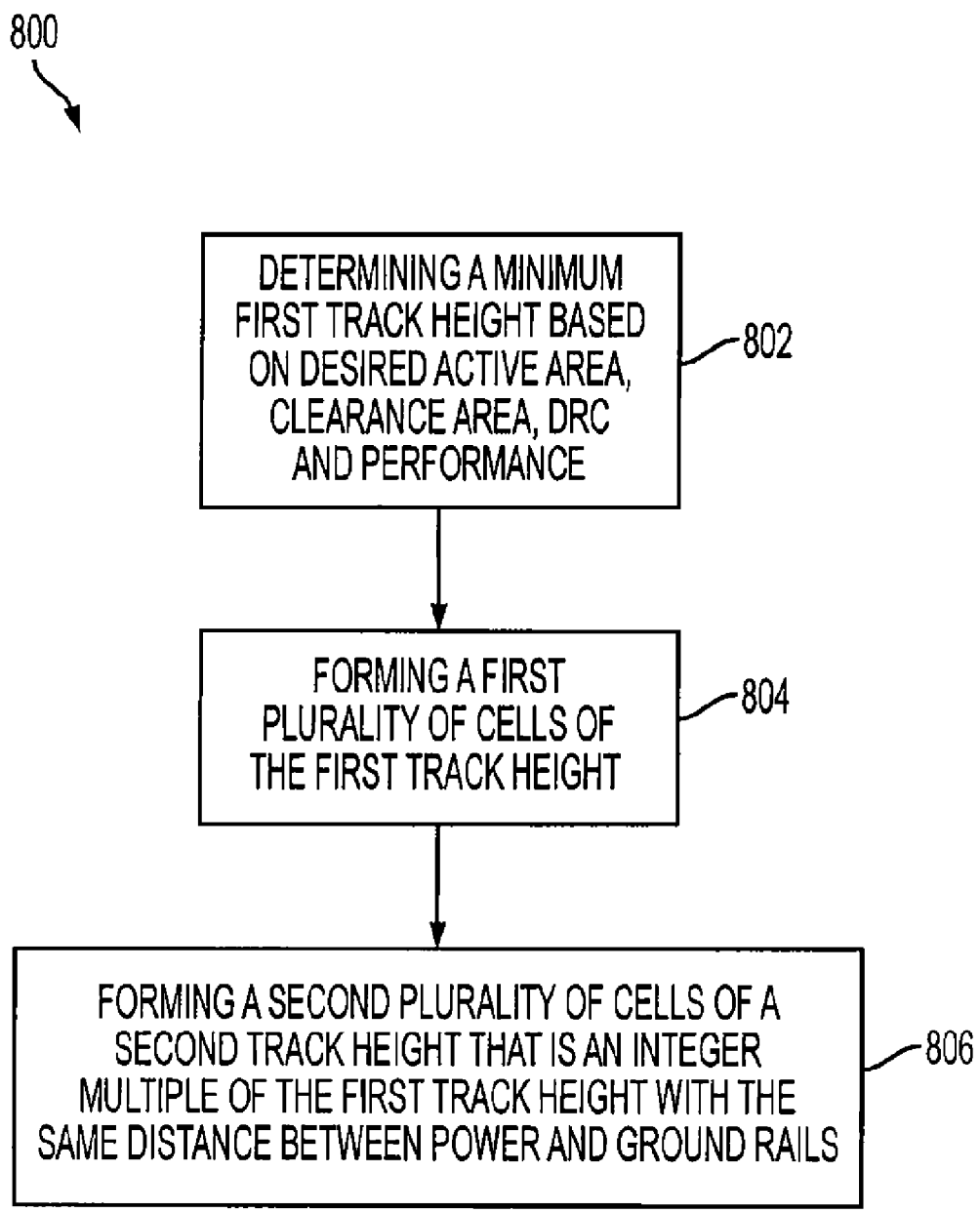
FIG. 8A illustrates an example flowchart showing steps performed to create a mixed height cell library according to an embodiment of the invention.

FIG. 8A is an example flowchart 800 illustrating steps performed to create a mixed height cell library, according to an embodiment of the invention. Flowchart 800 will be described with continued reference to the example embodiments depicted in FIGS. 3-4. However, flowchart 800 is not limited to these embodiments. Note that some steps shown in flowchart 800 do not necessarily to have to occur in the order shown.

In step 802, a minimum first track height is determined based on a desired amount of active area, clearance area, design rule check (DRC) constraints and performance requirements. For example, a minimum track height X as illustrated in FIGS. 3A and 4A is determined based on a desired amount of active area, clearance area, design rule constraints and performance requirements.

In step 804, a first plurality of cells of the first track height are created. For example, cell 300 of track height X is created.

In step 806, a second plurality of cells of a second track height that is an integer multiple of the first track height are created while maintaining the same distance between power and ground rails as the first plurality of cells. For example, cell 302 and cell 402 may be created with a track height that is twice that of cell 300. The distance between power and ground rail of cell 302 and cell 402 is the same as the distance between the power and ground rail of cell 300 enabling cell 300, cell 302 and/or cell 402 to be coupled at respective power and ground rail lines. As described above, cell 302 is created by stretching the active areas i.e. p-type diffusion material 304 and n-type diffusion material 306. Cell 402 is created by forming a mirror image of cell 300 along a horizontal axis that passes through its power rail line while maintaining the distance between power rail 408 and ground rail 410 to be the same as the distance between power rail 310 and ground rail 312.

Figure 8B:
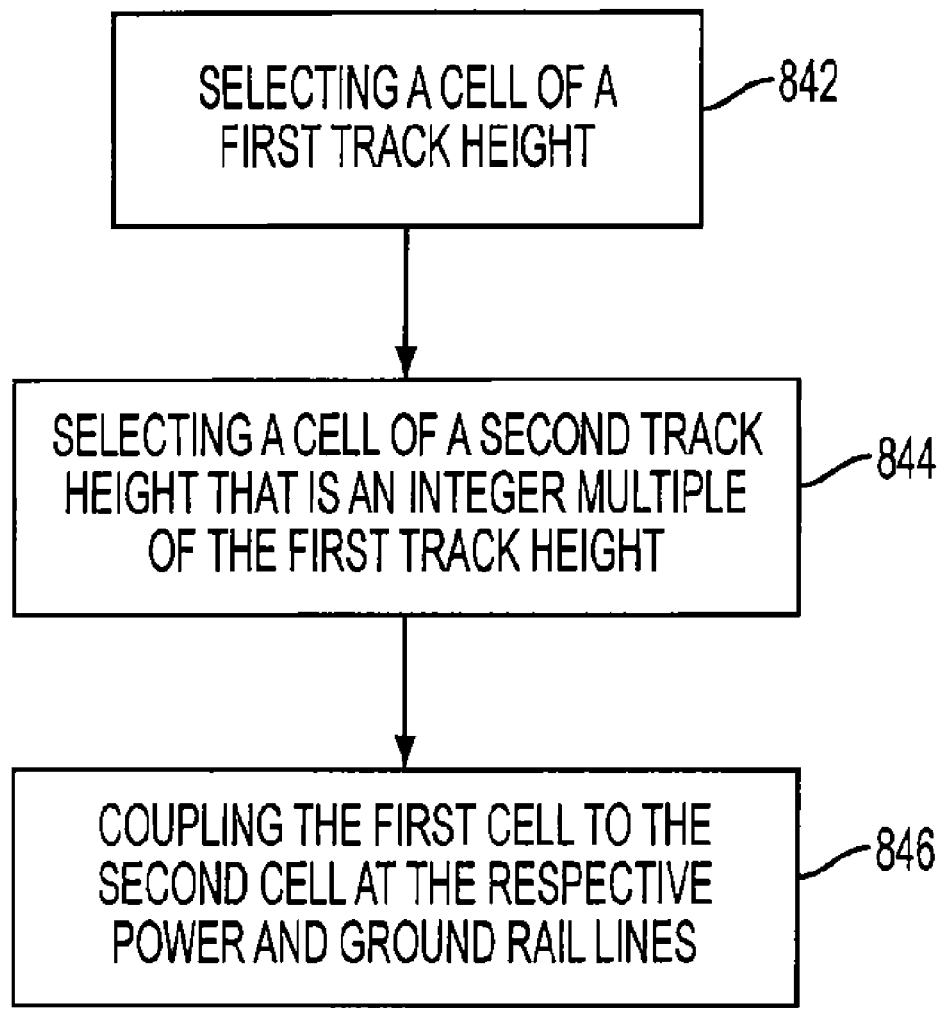
FIG. 8B illustrates an example flowchart showing steps performed to use a mixed-height cell library according to an embodiment of the invention.

FIG. 8B illustrates an example flowchart 840 illustrating steps performed to use a mixed height cell library according to an embodiment of the invention. Flowchart 840 will be described with continued reference to the example embodiments depicted in FIG. 3-4. However, flowchart 840 is not limited to these embodiments. Note that the steps shown in flowchart 840 do not necessarily have to occur in the order shown.

In step 842, a cell of a first track height is selected. For example, cell 300 of a track height X is selected.

In step 844, a cell of a second track height is selected that is an integer multiple of the cell of the first track height from step 842. For example, cell 302 of track height 2X is selected. In step 846, the first cell is coupled with the second cell at the respective power and ground rail lines. For example, cell 300 is coupled to cell 302 at respective power and ground rail lines since the distance between power and ground rail lines for cell 300 and cell 302 in the mixed height library are the same. In another example, cell 300 is coupled to double track height cell 402 by coupling power rail 310 to power rail 408 and ground rail 312 to ground rail 410.

Figure 9A:
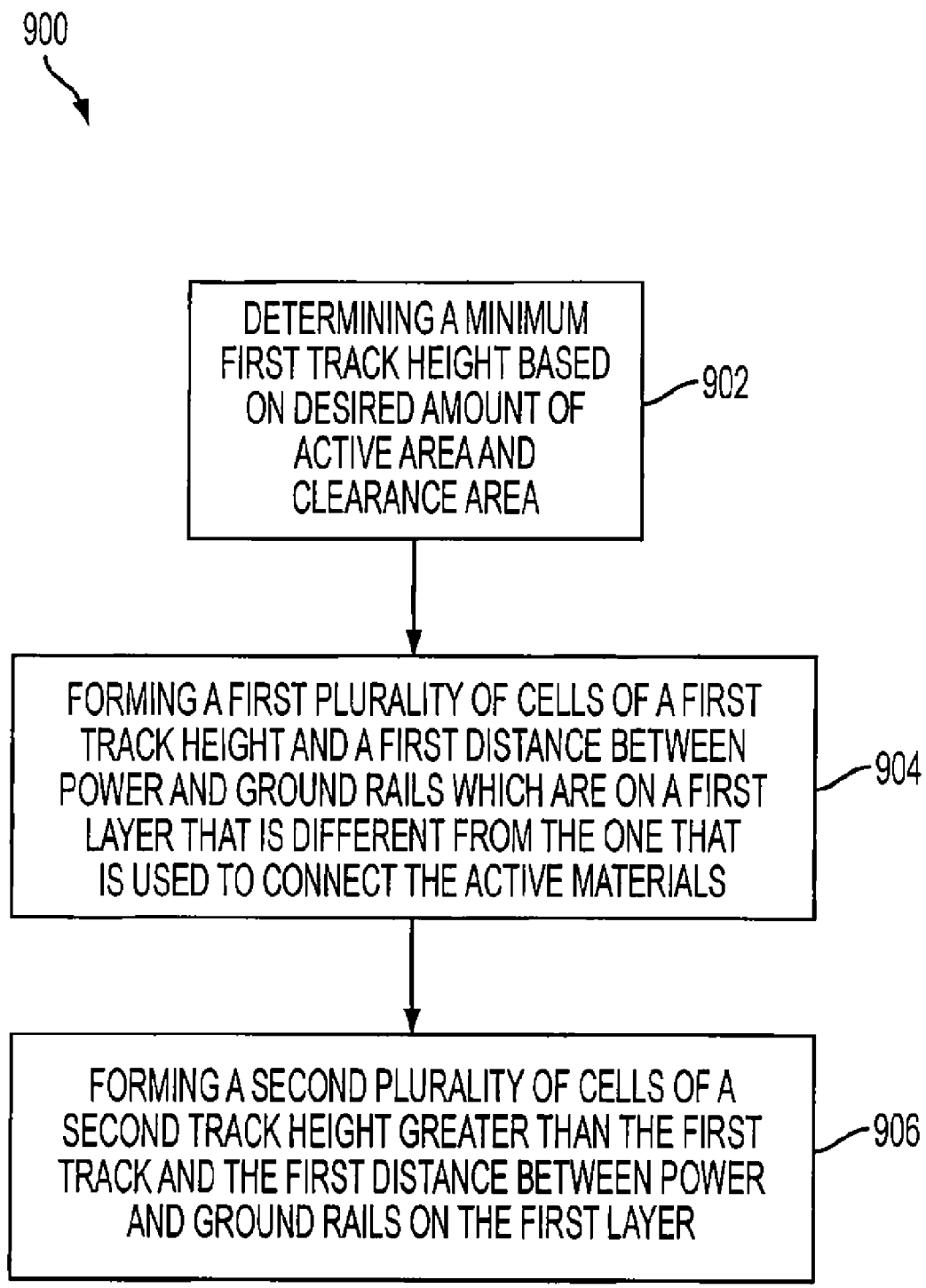
FIG. 9A illustrates an example flowchart showing steps performed to create a mixed-height cell library according to an embodiment of the invention.

FIG. 9A illustrates an example flowchart 900 illustrating steps performed to create a mixed height cell library, according to an embodiment of the invention. In contrast to the example embodiment in flowchart 800, the present embodiment in flowchart 900 does not require mixed-height cells to be integer multiples in height. Flowchart 900 will be described with continued reference to the example operating environment depicted in FIGS. 5A-C. However, flowchart 900 is not limited to these embodiments. Note that some steps shown in flowchart 900 do not necessarily have to occur in the order shown.

In step 902, a minimum first track height is determined based on one or more of desired active area, clearance area, design rule check (DRC) constraints and performance requirements. For example, a minimum track height X as illustrated in FIG. 5A is determined based on a desired amount of active area, clearance area, design rule constraints and performance requirements.

In step 904, a first plurality of cells of a first track height as determined in step 902 are created with a first distance between power and ground rails. The distance between power and ground rails is determined based on desired clearance area and DRC constraints. The power and ground rails are created on a different layer than the one that is used to connect active materials (p-type diffusion material and n-type diffusion material). For example, cell 500 of track height X is created. Power rail 504 and ground rail 506 of cell 500 are on a layer (e.g. metal layer 2) that is different from a layer (e.g. metal layer 1) that is used to connect p-type diffusion material 505 and n-type diffusion material 507.

In step 906, a second plurality of cells of a track height Y that is greater than a track height X are created. The distance between power and ground rails for the second plurality of cells is the same as the distance between power and ground rails for the first plurality of cells from step 904. For example, cell 502 of a track height Y that is greater than a track height X of cell 500 is created. Power rail 508 and ground rail 510 of cell 502 are on the same layer as power rail 504 and ground rail 506 of cell 500. P-type diffusion material 512 and n-type diffusion material 516 are on the same layer as p-type diffusion material 505 and n-type diffusion material 507. Power rail 508 and ground rail 510 of cell 502 can overlap p-type diffusion material 512 and n-type diffusion material since they are on a different layer than the one that is used to connect p-type diffusion material 512 and n-type diffusion material 516.

Figure 9B:
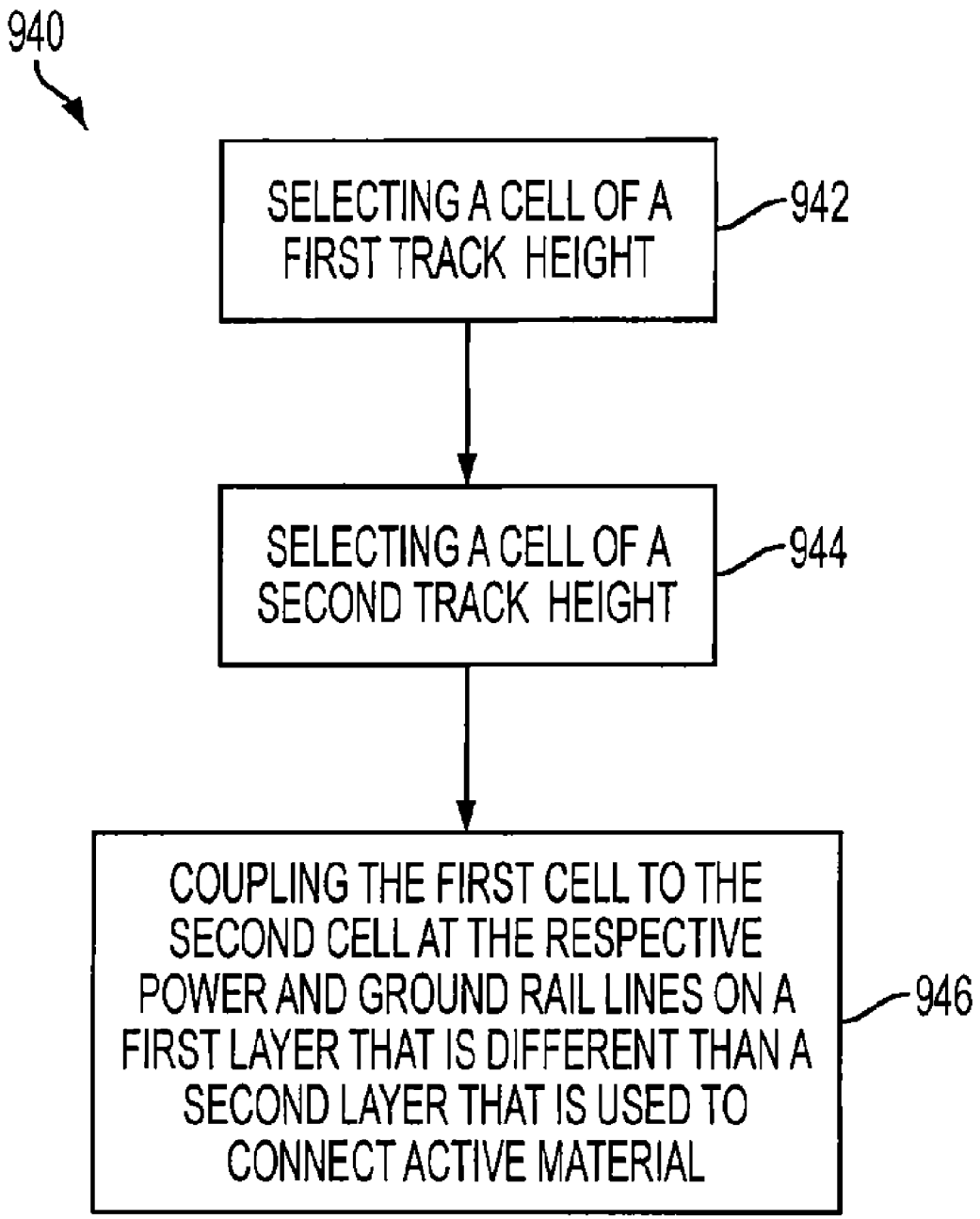
FIG. 9B illustrates an example flowchart showing steps performed to use cells from a mixed-height cell library according to an embodiment of the invention.

FIG. 9B illustrates an example flowchart 940 illustrating steps performed to use cells from a mixed track library, according to an embodiment of the invention. Flowchart 940 will be described with continued reference to the example embodiment depicted in FIGS. 5A-C. However, flowchart 940 is not limited to these embodiments. Note that some steps shown in flowchart 940 do not necessarily have to occur in the order shown.

In step 942, a cell of a first track height is selected. For example, cell 500 of a track height X is selected.

In step 944, a cell of a second track height greater or lesser than the first track height is selected. For example, cell 502 of a track height Y that is greater than track height X of cell 500 is selected.

In step 946, the first cell of the first track height is coupled to the second cell the second track height at respective power and ground rail lines. The power and ground rail lines of the respective cells are at a different layer than the one that is used to connect the respective active areas of the two cells. For example, power rail 504 is coupled to power rail 508 and ground rail 506 is coupled to ground rail 510 of cell 502. In another example, as shown in FIG. 5C, cell 552b and cell 554B are combined with cells of a lesser track height in row 560 since the power and ground rail lines of cell 552B and cell 554B are at the same distance as the power and rail lines of other cells in row 560.

4.0 Method for Mixed-Height Cell Placement and Optimization

Figure 10:
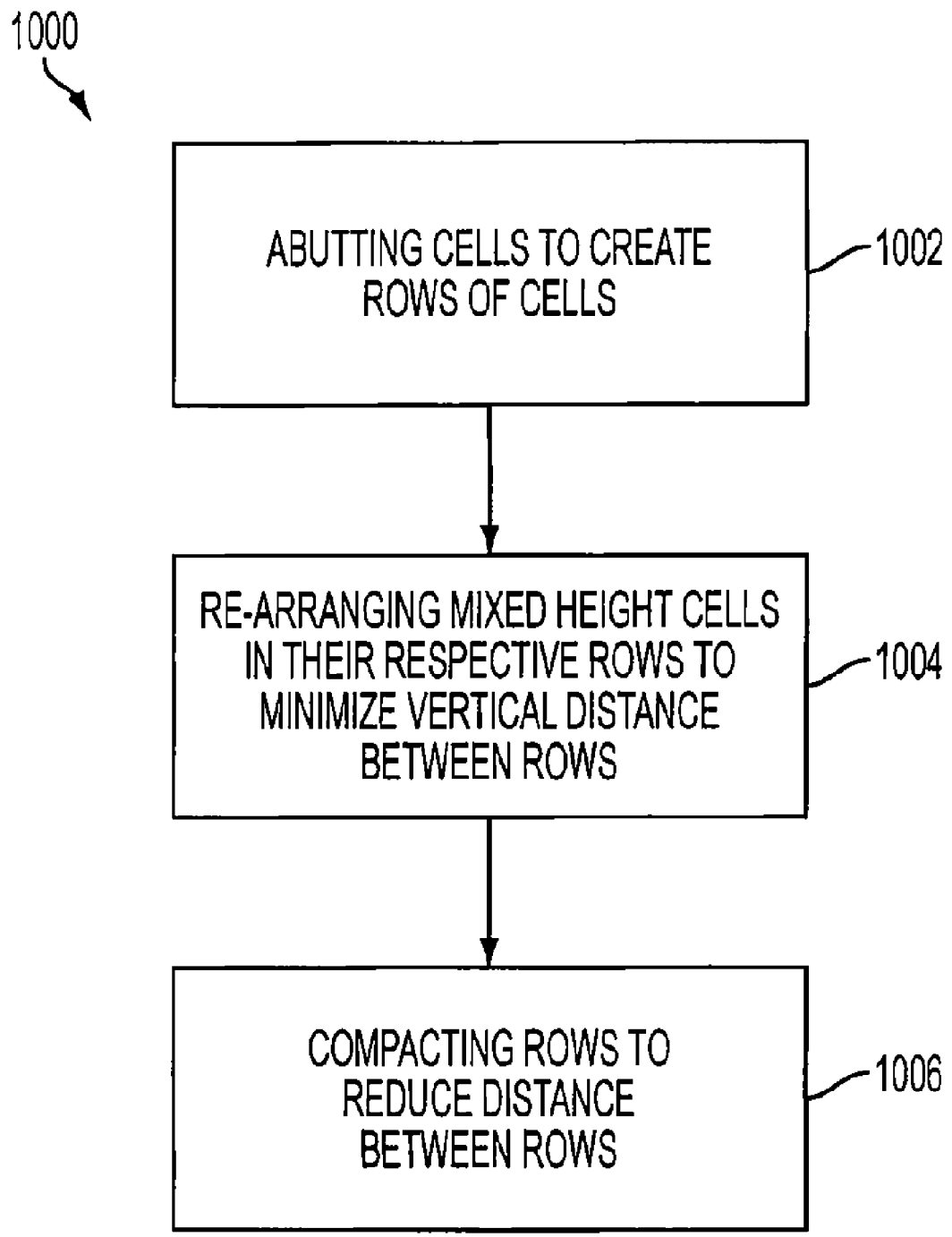
FIG. 10 illustrates an example flowchart showing steps performed to optimize a floorplan according to an embodiment of the invention.

FIG. 10 illustrates an example flowchart 1000 illustrating steps performed to optimize a floorplan according to an embodiment of the invention. Flowchart 1000 will be described with continued reference to the example in operating environment depicted in FIGS. 6A-D. However, flowchart 1000 is not limited to these embodiments. Note that some steps shown in flowchart 1000 do not necessarily have to occur in the order shown.

Figure 6A:
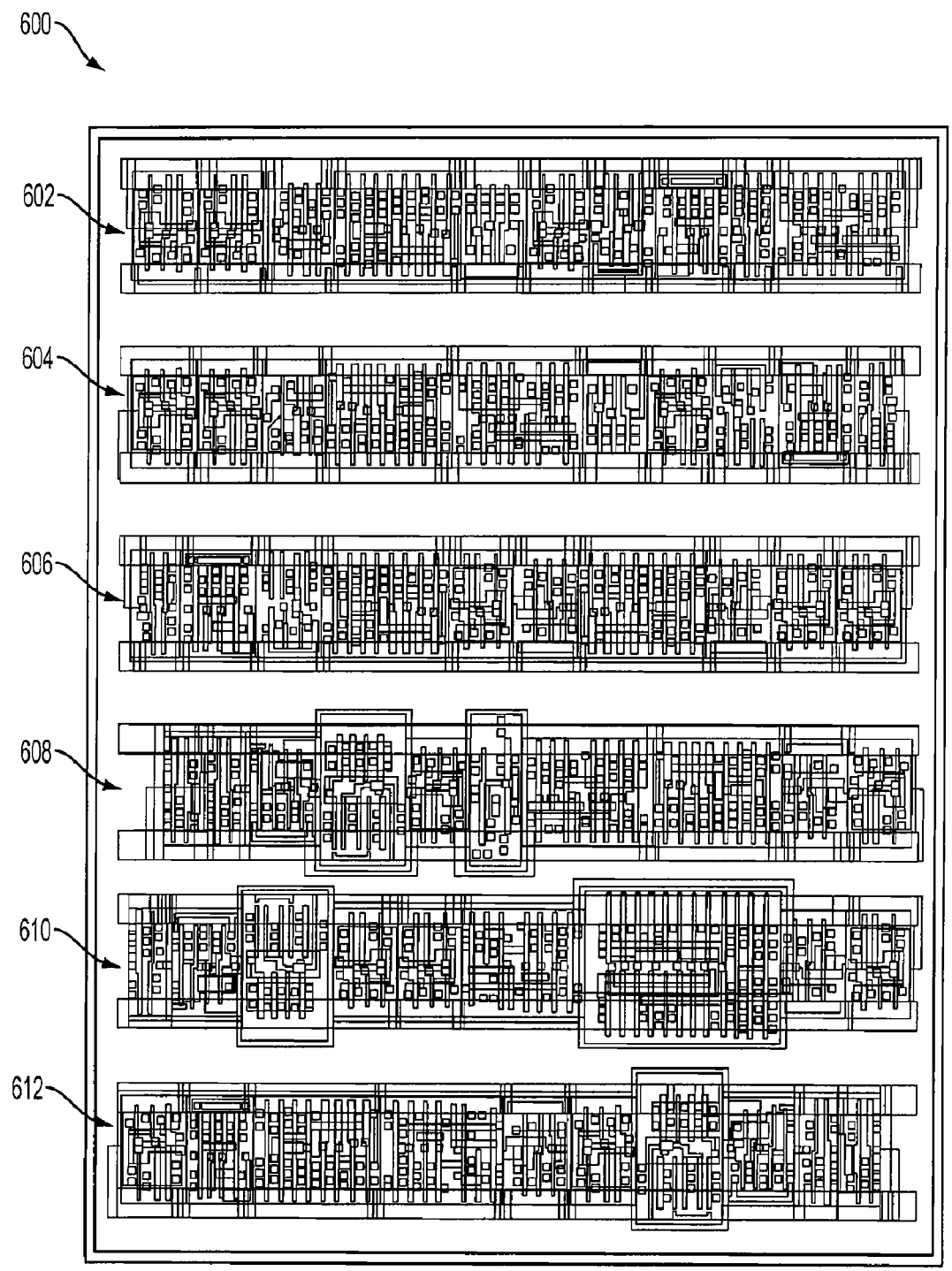
FIG. 6A illustrates an example floorplan prior to optimization.

In step 1002, cells of the same and/or different track height are abutted at respective power and ground rails to form multiple rows of cells. For example, FIG. 6A illustrates an example initial placement of cells in this step. Floorplan 600 includes six rows of cells 602-612. Row 602, row 604 and row 606 have cells of the same track height. Rows 608-612 includes cells of mixed track heights that are combined together using the techniques described above. Row 608, row 610 and row 612 have cells of different track heights coupled at respective power and ground rails that are at a different layer than the one that is used to connect active areas for the cells 602-612.

During initial placement, floorplan 600 has the worst case row spacing for all rows. The worst case row spacing is determined by the height of the highest cells in adjacent rows that face each other. As seen in FIG. 6A, row 608, row 610 and row 612 cannot be compacted together because of overlap in active areas of different sized cells.

Figure 6B:
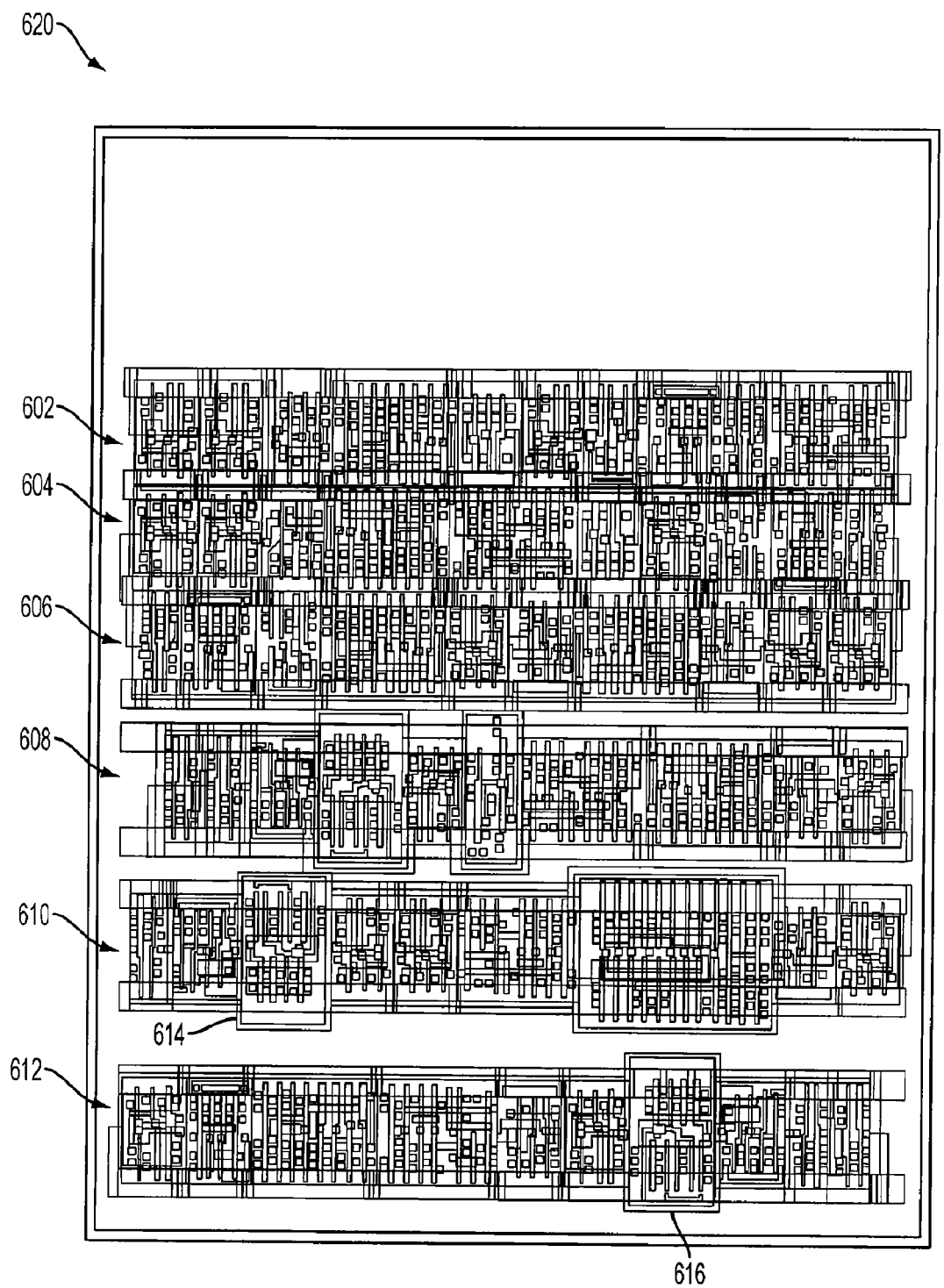
FIG. 6B illustrates a floorplan as a result of a first compaction step according to an embodiment of the invention.

In step 1004, cells in rows having mixed-height cells are rearranged within their respective rows based so as to minimize the vertical distance between adjacent rows. In many cases, a lot of area can be recovered by local transformations of the placement. Step 1004 is optional. FIG. 6B illustrates an floorplan 620 which is a result of step 1004. In floorplan 620, row 602, row 604 and row 606 are compacted to reduce the distance between them since the cells in row 602, row 604 and row 606 have the same track height. In step 1004, rows that do not have vertical space constraints may be compacted to reduce distance between them for initial floorplan optimization. In contrast, the cells in row 608, row 610 and row 612 cannot be compacted because of potential overlap of active areas of cells having different track heights. However, according to an embodiment of the invention, cells in row 608, 610 and 612 can be re-ordered within their respective rows to further allow compaction of row 608, row 610 and row 612. For example, cell 614 in row 610 and cell 616 in row 612 may be re-ordered in respective row 610 and row 612 to remove vertical row constraints which allow further compaction of row 608, row 610 and row 612.

Figure 6C:
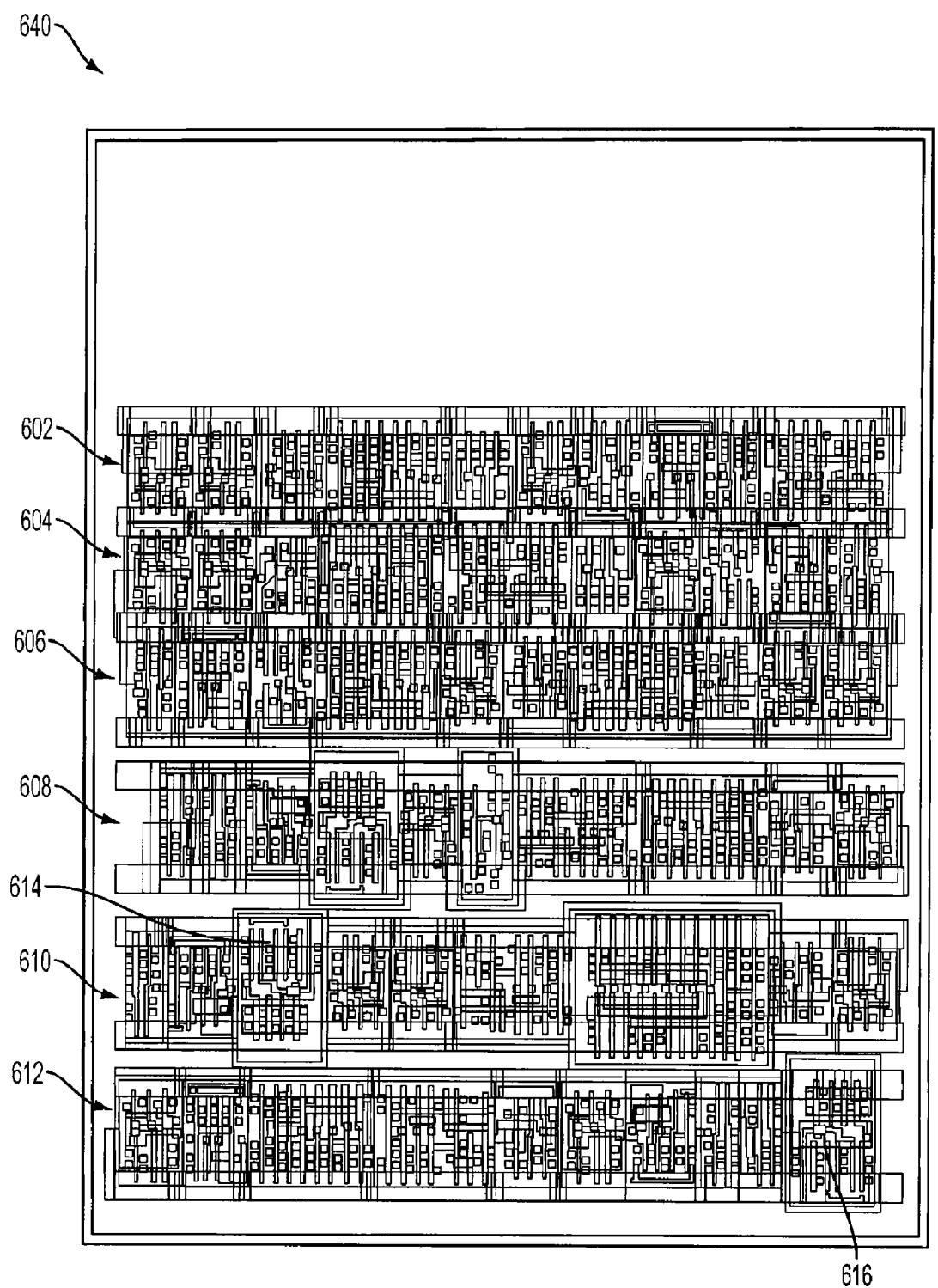
FIG. 6C illustrates a floorplan as a result of a second compaction step according to an embodiment of the invention.
Figure 6D:
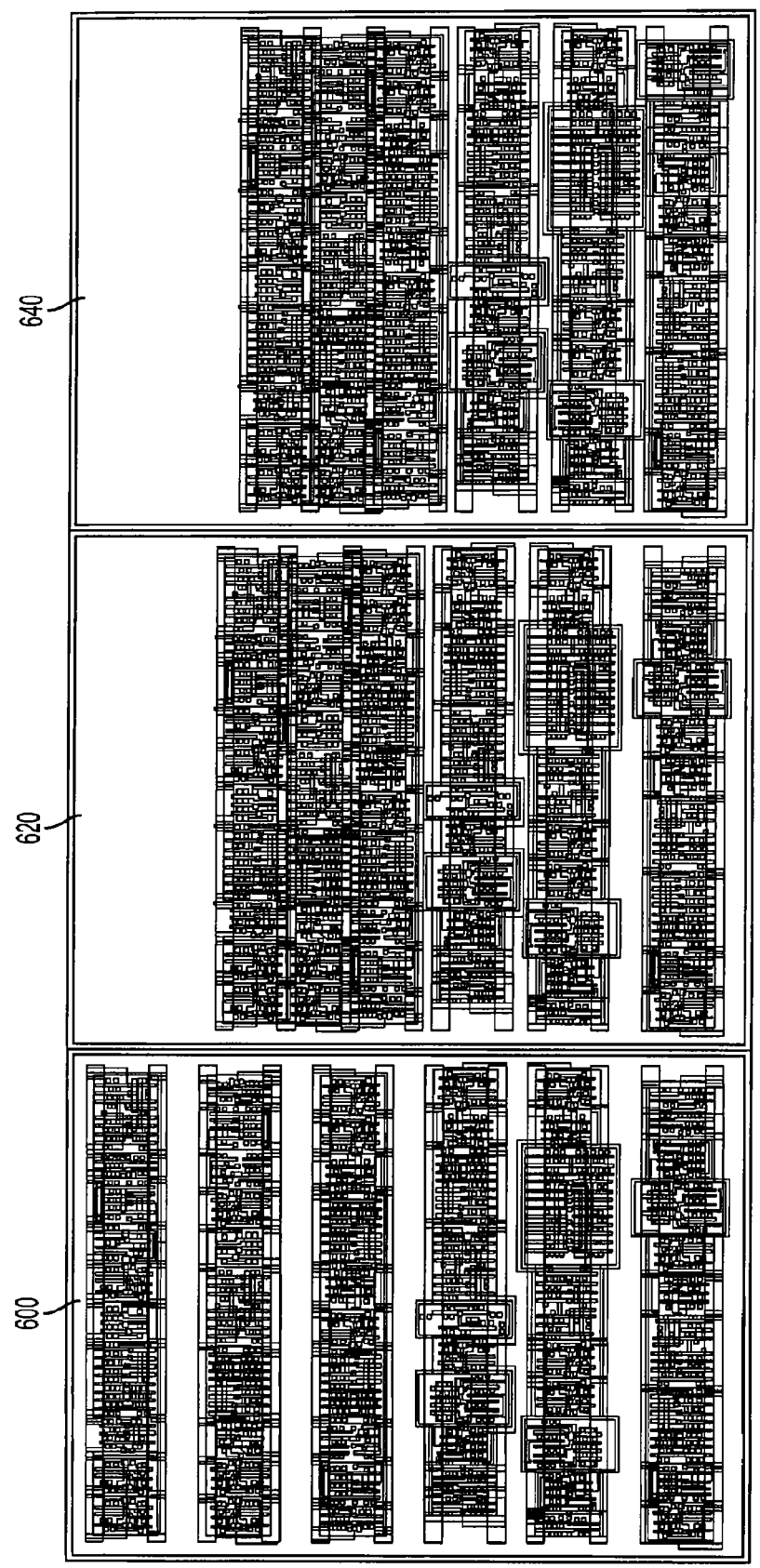
FIG. 6D illustrates a side-by-side comparison of floorplans before and after compaction.

In step 1006, the rows with re-arranged cells are compacted to further reduce the distance between adjacent rows. FIG. 6C illustrates a floorplan as a result of a second compaction step according to an embodiment of the invention. As seen in FIG. 6C, floorplan 640 illustrates further compaction of row 608 with row 610 and of row 610 with row 612, due to re-ordering of cell 614 and cell 616 within respective rows. Rearranging cells within rows requires rerouting to compensate for the rearrangement. Routing adjustments are made to row 610 and row 612 to compensate for the re-ordering of cell 614 and cell 616. The decision on which cells are to be re-ordered may also be based on critical path constraints and the extent of required rerouting. In an embodiment, only rows that are not part of a critical path are eligible for re-arrangement of cells. FIG. 6D illustrates a side-by-side comparison of floorplan 600 and floorplan 640. As seen in FIG. 6D, floorplan 620 provides a much more compact floorplan than floorplan 600 due to compaction of the top three rows 602-606. Floorplan 640 provides further compaction in comparison to floorplan 620 due to rearrangement of cells 616 and 614 which allows for further compaction of the bottom three rows 610-612.

Figure 7A:
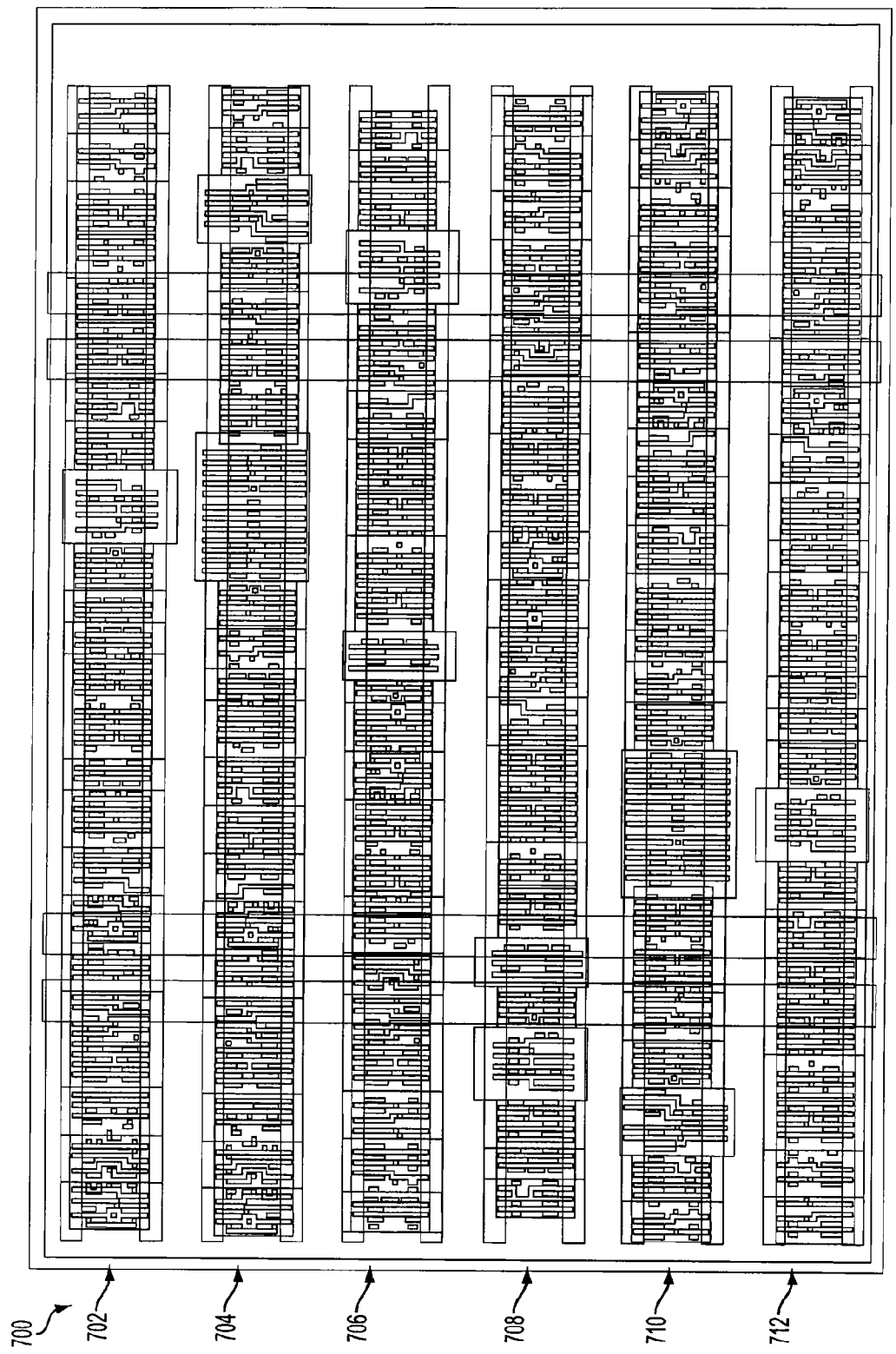
FIG. 7A illustrates placement of mixed height cells prior to optimization.
Figure 11:
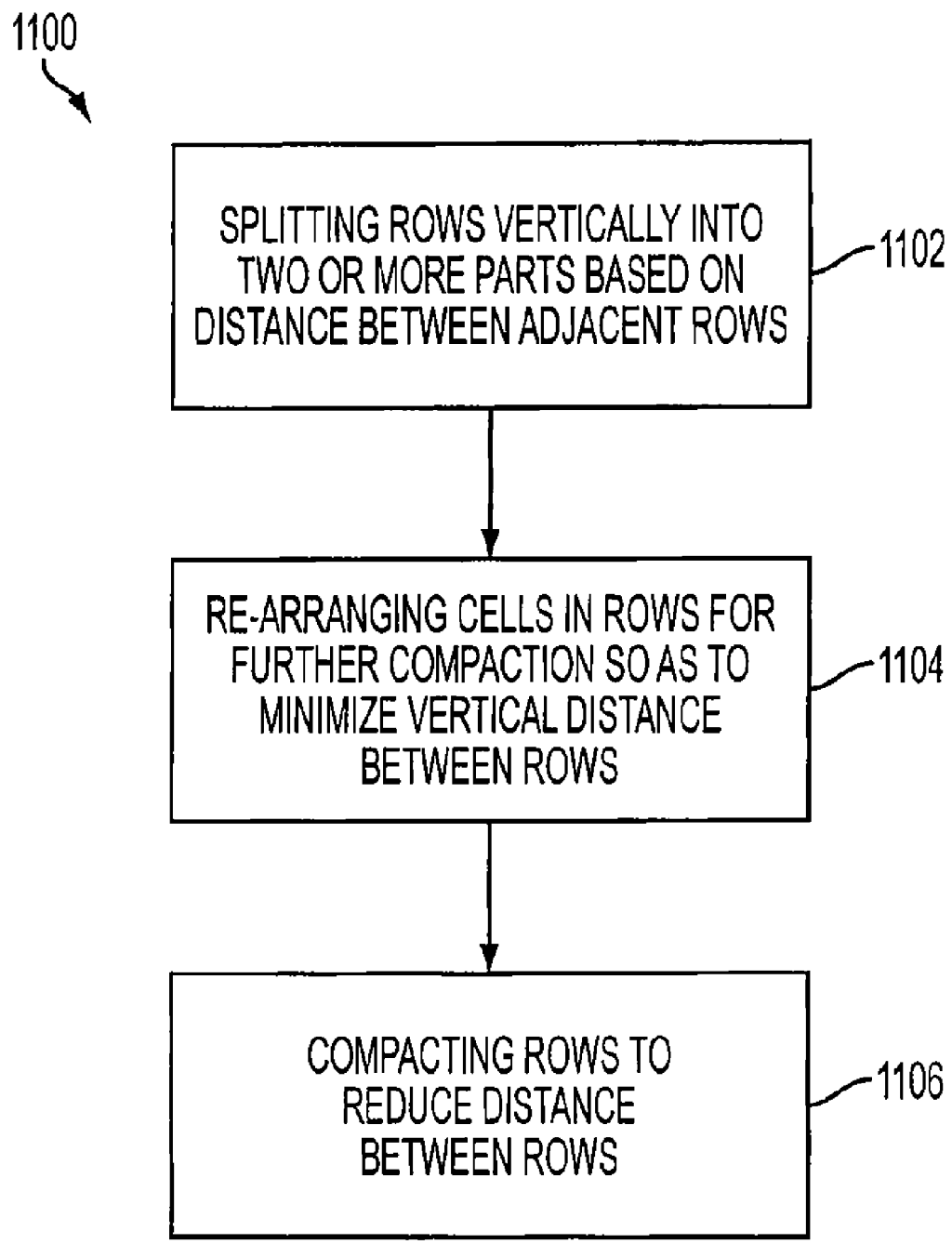
FIG. 11 illustrates an example flowchart showing steps performed to optimize placement of cells according to an embodiment of the invention.

FIG. 11 illustrates an example flowchart 1100 illustrating steps performed to optimize placement of cells, according to an embodiment of the invention. For example, flowchart 1100 will be described with continued reference to the example embodiments depicted in FIGS. 7A-D. However, flowchart 1100 is not limited to these embodiments. Note that some steps shown in flowchart 1100 do not necessarily have to occur in the order shown. FIG. 7A illustrates placement of mixed height cells in floorplan 700 prior to the optimization steps of flowchart 1100. Floorplan 700 includes rows 702-712. In this example, each of the rows 702-712 include at least one cell having a larger track height than other cells in the row. The minimum possible separation between rows 702-712 under design rules constraints is determined based on the highest cells that face each other in adjacent rows. For example, the vertical distance between adjacent rows determines the amount of compaction that is possible for each row.

Figure 7B:
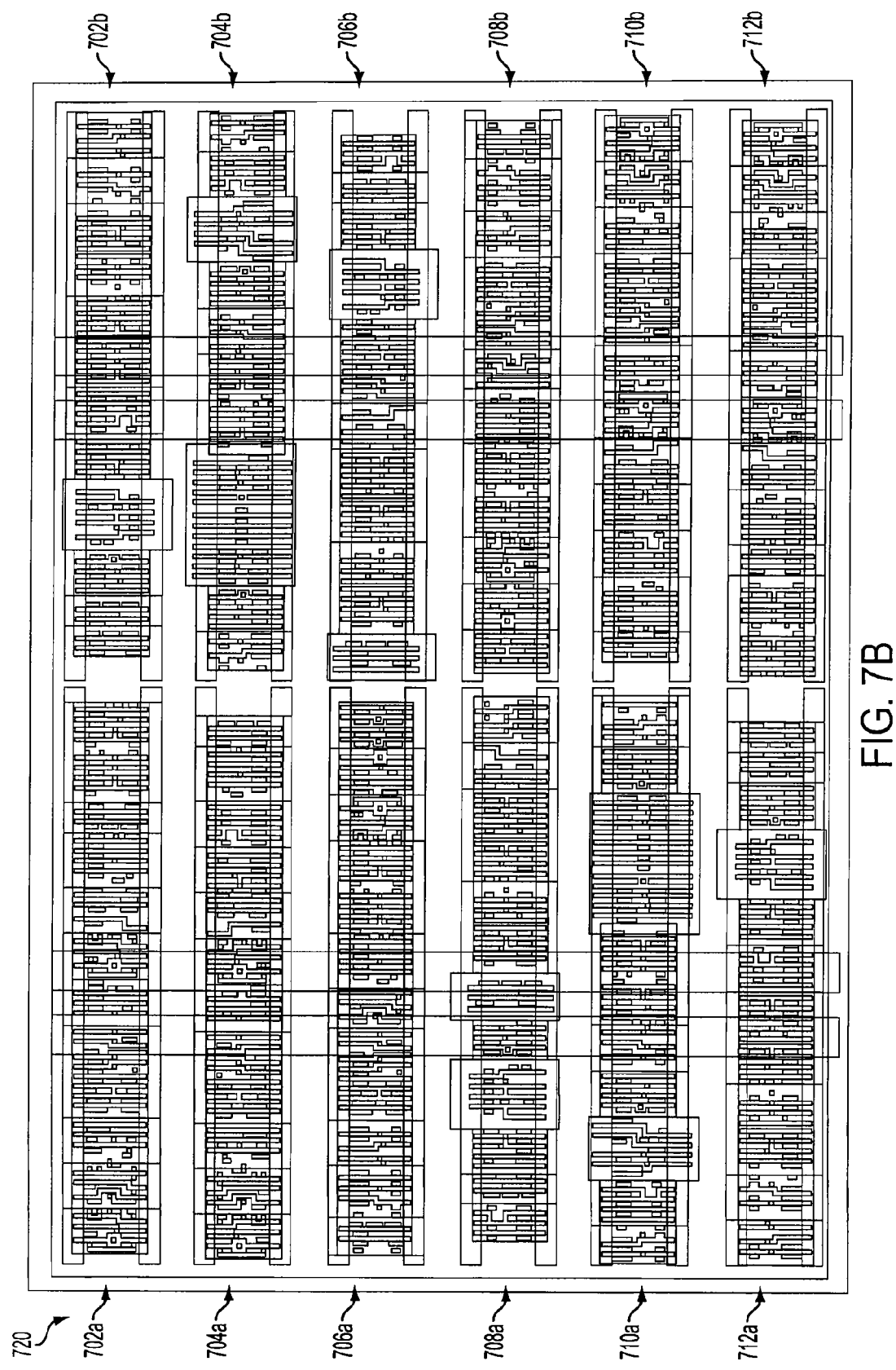
FIG. 7B illustrates a floorplan derived from a first optimization step according to an embodiment of the invention.

In step 1102, rows are split vertically into two or more portions based on distance between adjacent rows. For example, a first portion of adjacent rows may include cells such that opposing cells in adjacent rows are of the same height while a second portion of adjacent rows may includes cells of different track height are facing each other. If the rows are split into the first and second portions then the first portion of the adjacent row can be further compacted compared to the second portion. FIG. 7B illustrates a floorplan 720 derived from step 1102. In FIG. 7B rows 702-712 from the floorplan 700 are vertically split to form rows 702a-712a and rows 702b-712b. Since each row in floor plan 720 has been divided into two distinct rows, each of the split rows can be optimized individually for compaction. Rows 702a-c and rows 708b-712b have cells of the same track height and can be further compacted.

In step 1104, cells may be re-ordered within the respective rows to further allow compaction between adjacent rows. For example, cells in rows 708a-712a may be re-ordered within their respective rows so as to minimize the vertical distance between adjacent rows.

Figure 7C:
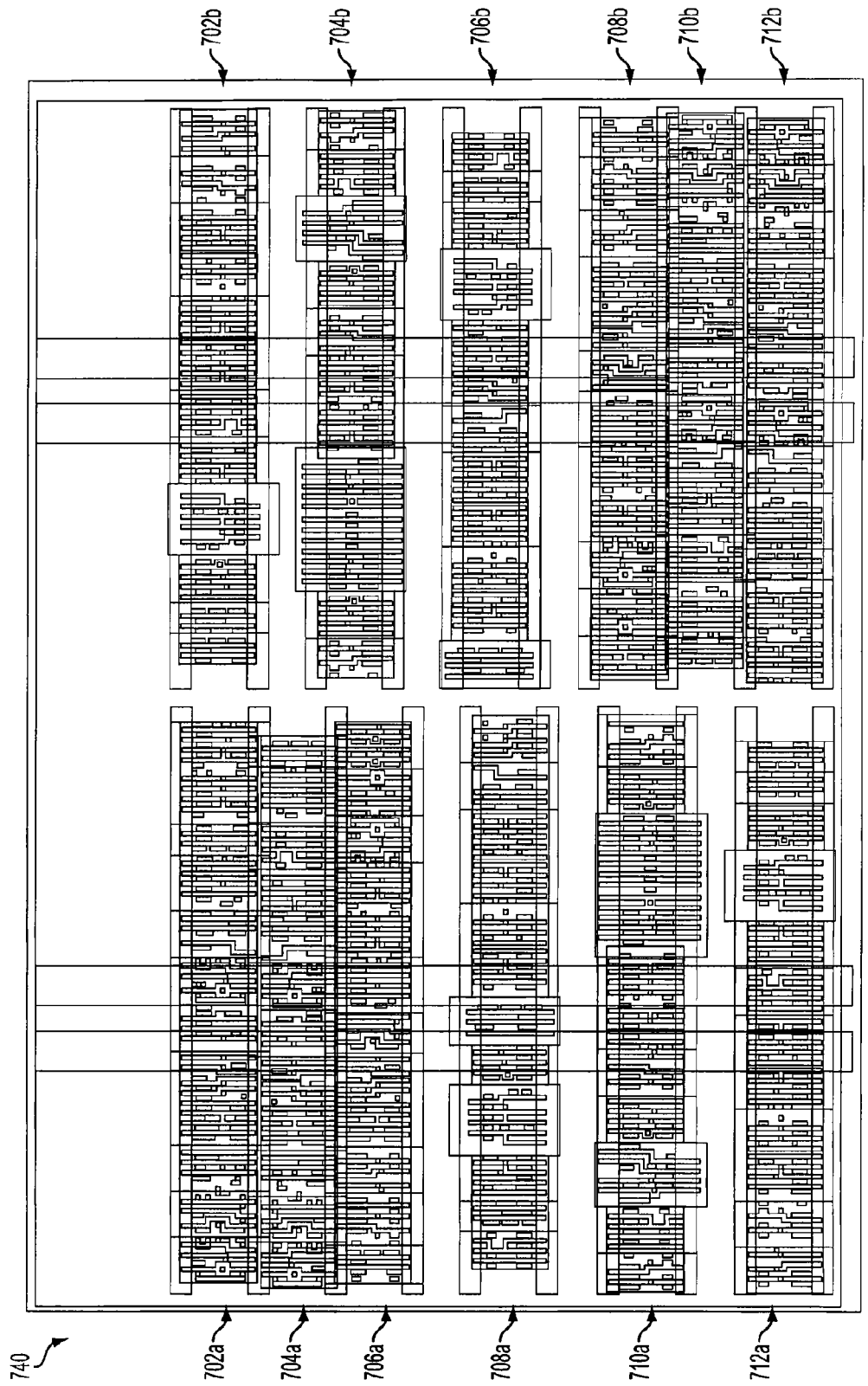
FIG. 7C illustrates an example floor plan derived from a second optimization step according to an embodiment of the invention.
Figure 7D:
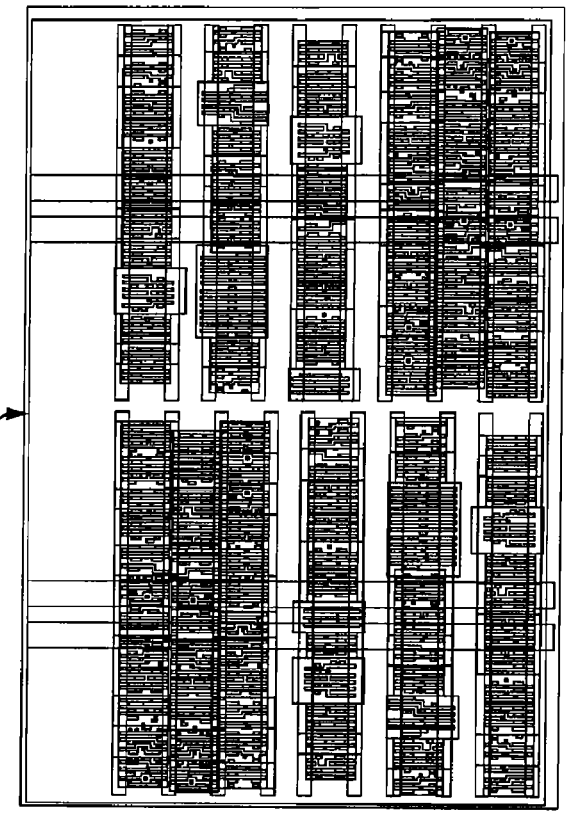
FIG. 7D illustrates a side-by-side comparison of floorplans before and after optimization.
Figure 7D:
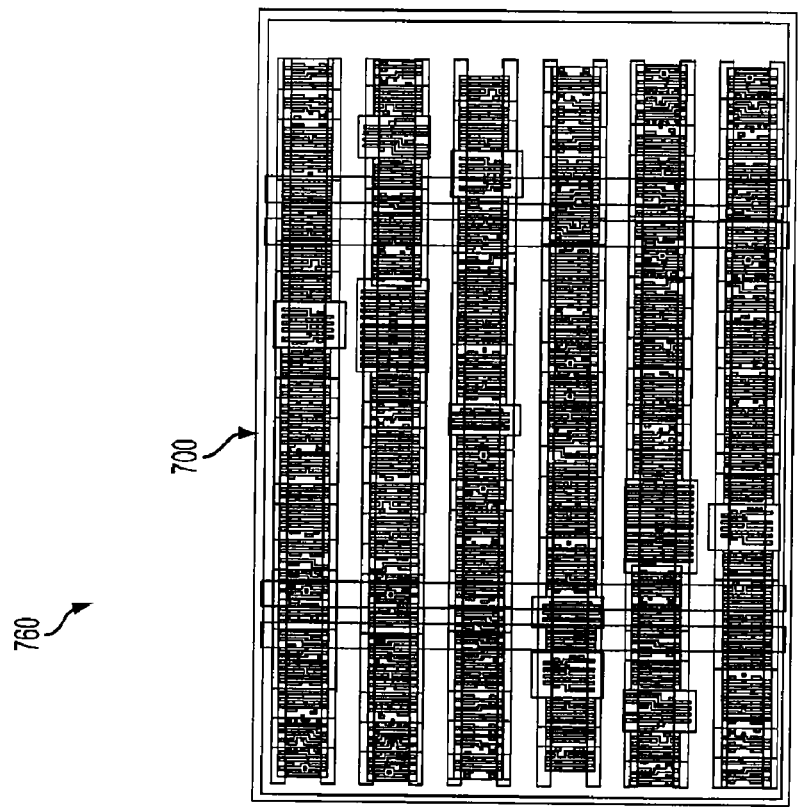

In step 1106, rows are compacted to reduce vertical distance between adjacent rows. FIG. 7C illustrates an example floor plan 740 derived from step 1106. In the example in FIG. 7C, rows 702a-706a and rows 708b-712b from floorplan 720 have been compacted to generate area-efficient floorplan 740. The compaction in floor plan 740 is possible because rows 702-712 were split into two slices thereby allowing slices to be compacted further. In an embodiment, cells within split rows 702a-712a and 702b-712b may be re-ordered (as described in FIGS. 6A-D) to allow for further compaction between rows. FIG. 7D illustrates a side-by-side comparison of floorplan 700 and floorplan 740. As seen in FIG. 7D, significant savings in area are achieved by splitting and compacting rows in floorplan 700 to form floorplan 740.

Although FIGS. 7B-7D depict two slices, any number of slices can be used in the optimization. In this method, the area penalty introduced by two maximum height cells that share an x-span is reduced to a slice in which they reside and is not propagated to the entire row. This allows the compaction and optimizations described in flowchart 1100 to be performed on a slice by slice basis.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A computer-aided method for optimizing a physical layout of a circuit formed using cells of different track heights, comprising:
    selecting a plurality of cells necessary to construct the circuit using a computer, wherein two or more cells in the plurality of cells have different track heights;
    joining the plurality of cells to form the circuit by coupling a power rail of a cell with a first track height to a power rail of a cell with a second track height at a secondary layer and by coupling a ground rail of the cell with the first track height to a ground rail of the cell with the second track height at the secondary layer, wherein the secondary layer is different from a primary layer, and wherein the primary layer is used to connect active material; and
    compacting adjacent rows by abutting power rail lines or ground rail lines of adjacent rows so as to minimize distance between rows within design rules check constraints.

2. The method of claim 1, further comprising forming the plurality of cells such that a distance between a power line and a rail line for a cell with a higher track height is the same as a distance between a power line and a rail line for a cell with a lower track height.

3. The method of claim 1, further comprising forming the plurality of cells such that a drive strength of a cell with a higher track height is greater than a drive strength of a cell with a shorter track height.

4. The method of claim 1, further comprising forming the plurality of cells such that a leakage power of a cell with a higher track height is greater than a leakage power of a cell with a shorter track height.

5. The method of claim 1, further comprising forming the plurality of cells such that a first plurality of cells of the first track height includes a first set of logic functions.

6. The method of claim 5, further comprising forming the plurality of cells such that a second plurality of cells of the second track height includes a corresponding second set of logic functions that are equivalent in logic to the first set of logic functions and have a greater drive strength and leakage power compared to the corresponding first plurality of cells.

7. A computer-based mixed-height cell library for designing a circuit, comprising:
    a computer-based first plurality of cells having a first track height;
    a computer-based second plurality of cells having a second track height and configured to be coupled to the first plurality of cells at respective power and ground rail lines;
    wherein the first and second plurality of cells are configured to be coupled at respective power and ground rail lines at a secondary layer, wherein the secondary layer is different from a primary layer, and wherein the primary layer is used to connect active material and wherein cells in adjacent rows are abutted at power rail lines or ground rail lines of adjacent rows.

8. The mixed-height cell library of claim 7, wherein a drive strength of a cell with a higher track height is greater than a drive strength of a cell with a shorter track height.

9. The mixed-height cell library of claim 7, wherein a leakage power of a cell with a higher track height is greater than a leakage power of a cell with a shorter track height.

10. The mixed-height cell library of claim 7, wherein a distance between a power line and a rail line for a cell with a higher track height is the same as a distance between a power line and a rail line for a cell with a lower track height.

11. The mixed-height cell library of claim 7, wherein the first plurality of cells of the first track height includes a first set of logic functions.

12. The mixed-height cell library of claim 11, wherein the second plurality of cells of the second track height include a corresponding second set of logic functions that are equivalent in logic to the first set of logic functions and have a greater drive strength and leakage power compared to the corresponding first plurality of cells.

13. An integrated circuit, comprising:
    a first cell having a first track height;
    a second cell having a second track height and configured to be coupled to the first cell at respective power and ground rail lines;
    wherein the first and second cells are configured to be coupled at respective power and ground rail lines at a secondary layer, wherein the secondary layer is different from a primary layer, and wherein the primary layer is used to connect active material and wherein cells in adjacent rows are abutted at power rail lines or ground rail lines of adjacent rows.

14. The integrated circuit of claim 13, wherein a distance between a power line and a rail line for a cell with a higher track height is the same as a distance between a power line and a rail line for a cell with a lower track height.

15. The integrated circuit of claim 13, wherein a drive strength of a cell with a higher track height is greater than a drive strength of a cell with a shorter track height.

16. The integrated circuit of claim 13, wherein a leakage power of a cell with a higher track height is greater than a leakage power of a cell with a shorter track height.

17. The integrated circuit of claim 13, wherein the first cell has the first track height and includes a first logic function.

18. The integrated circuit of claim 17, wherein the second cell has the second track height and includes a second logic function that is equivalent in logic to the first logic function and has a greater drive strength and leakage power compared to the first cell.

* * * * *